US009552966B2

(12) United States Patent
Komatsu et al.

(10) Patent No.: US 9,552,966 B2
(45) Date of Patent: Jan. 24, 2017

(54) ANTENNA FOR PLASMA GENERATION, PLASMA PROCESSING APPARATUS AND PLASMA PROCESSING METHOD

(71) Applicant: Tokyo Electron Limited, Tokyo (JP)

(72) Inventors: Tomohito Komatsu, Yamanashi (JP); Taro Ikeda, Yamanashi (JP); Shigeru Kasai, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 166 days.

(21) Appl. No.: 14/364,434

(22) PCT Filed: Dec. 5, 2012

(86) PCT No.: PCT/JP2012/081570
§ 371 (c)(1),
(2) Date: Jun. 11, 2014

(87) PCT Pub. No.: WO2013/089007
PCT Pub. Date: Jun. 20, 2013

(65) Prior Publication Data
US 2014/0339981 A1 Nov. 20, 2014

Related U.S. Application Data

(60) Provisional application No. 61/576,042, filed on Dec. 15, 2011.

(30) Foreign Application Priority Data

Dec. 12, 2011 (JP) .................................. 2011-271435

(51) Int. Cl.
*H01J 37/32* (2006.01)
*H05H 1/46* (2006.01)

(52) U.S. Cl.
CPC ........ *H01J 37/3222* (2013.01); *H01J 37/3244* (2013.01); *H01J 37/32229* (2013.01);
(Continued)

(58) Field of Classification Search
None
See application file for complete search history.

(56) References Cited

U.S. PATENT DOCUMENTS 4,985,109 A * 1/1991 Otsubo ............. H01J 37/32357
118/50.1
6,914,005 B2 * 7/2005 Furuse ............. H01J 37/32449
438/706

(Continued)

FOREIGN PATENT DOCUMENTS

JP 2010-074154 4/2010
JP 2010-277971 12/2010

*Primary Examiner* — Alexander H Taningco
*Assistant Examiner* — Nelson Correa
(74) *Attorney, Agent, or Firm* — IPUSA, PLLC

(57) ABSTRACT

An antenna for plasma generation radiates a microwave transmitted through a coaxial waveguide into a processing chamber and propagates the microwave on a metal surface of the processing chamber to convert gas into surface wave plasma. The antenna includes a gas flow path for passing the gas through the antenna, a plurality of gas holes that communicate with the gas flow path and introduce the gas into the processing chamber, and a plurality of slots that are separated from the gas flow path and penetrate through the gas flow path. The slots pass the microwave transmitted through the coaxial waveguide and a slow-wave plate to the processing chamber. A first space between portions of adjacent slots penetrating through the gas flow path is arranged to be wider than a second space between portions of the adjacent slots opening out to a plasma generation space of the processing chamber.

16 Claims, 16 Drawing Sheets

(52) U.S. Cl.
CPC ......... *H01J 37/32449* (2013.01); *H05H 1/46* (2013.01); *H01J 2237/006* (2013.01); *H05H 2001/463* (2013.01); *H05H 2001/4615* (2013.01)

(56) References Cited

U.S. PATENT DOCUMENTS

| | | | | |
|---|---|---|---|---|
| 7,430,985 | B2* | 10/2008 | Kasai | ................ H01J 37/32192 |
| | | | | 118/723 MA |
| 7,469,654 | B2* | 12/2008 | Ishibashi | ........... H01J 37/32238 |
| | | | | 118/723 MW |
| 8,945,342 | B2* | 2/2015 | Ikeda | .................. H01J 37/3222 |
| | | | | 118/723 MW |
| 8,961,735 | B2* | 2/2015 | Fujino | ................ H01J 37/32211 |
| | | | | 118/723 MW |
| 9,263,298 | B2* | 2/2016 | Matsumoto | ....... H01J 37/32192 |
| 2014/0158302 | A1* | 6/2014 | Ikeda | ................ H01J 37/32201 |
| | | | | 156/345.41 |
| 2014/0361684 | A1* | 12/2014 | Ikeda | ...................... H05H 1/46 |
| | | | | 315/34 |

* cited by examiner

ANTENNA FOR PLASMA GENERATION, PLASMA PROCESSING APPARATUS AND PLASMA PROCESSING METHOD

CROSS-REFERENCE TO RELATED APPLICATIONS

The present application is a National Stage of International Application No. PCT/JP2012/081570 filed on Dec. 5, 2012, claiming priority based on Japanese Patent Application No. 2011-271435 filed on Dec. 12, 2011, and U.S. Provisional Application No. 61/576,042 filed on Dec. 15, 2011, the entire contents of which are hereby incorporated by reference.

TECHNICAL FIELD

The present invention relates to an antenna for plasma generation, a plasma processing apparatus, and a plasma processing method.

BACKGROUND ART

Plasma processing is an indispensable technique for manufacturing semiconductor devices. In view of the growing demand for higher and faster integration of large-scale integrated circuit (LSI) devices in recent years, there is a demand for techniques that enable finer micro-fabrication of semiconductor elements making up the LSI. However, the electron temperature of plasma generated in an inductively coupled plasma processing apparatus or a capacitively coupled plasma processing apparatus is rather high. Also, a region with an adequately high plasma density is rather limited. Thus, it has been difficult to provide a plasma processing technique that can adequately meet the demands of finer micro-fabrication of semiconductor elements.

To meet such demands for finer micro-fabrication of semiconductor elements, generation of plasma with a low electron temperature and a high plasma density is required. In this respect, Patent Document 1 discloses a micro-fabrication technique that involves generating plasma with a low electron temperature and a high plasma density by converting gas into plasma using a microwave output from a microwave output unit, and processing a workpiece using the generated plasma.

PRIOR ART DOCUMENTS

Patent Documents

Patent Document 1: Japanese Laid-Open Patent Publication No. 2010-74154

SUMMARY OF THE INVENTION

Problem to be Solved by the Invention

However, in Patent Document 1, the microwave and the gas are supplied from different positions. According to Patent Document 1, the microwave is discharged from the ceiling of a chamber whereas the gas is introduced from a latticed gas shower plate, which is arranged in a space between a susceptor and the ceiling of the chamber. When the gas is supplied from a space between the ceiling and the susceptor below the discharge position of the microwave in the manner described above, it is difficult to control the gas flow, and as a result, plasma control may not be effectively performed.

Also, because the latticed gas shower plate is made of quartz, the microwave penetrates through the gas shower plate. In such case, gas may turn into plasma within gas holes that are arranged at the gas shower plate and electrical discharge may occur within the gas holes to thereby cause microwave power loss and abnormal electrical discharge, for example.

In light of the above, an aspect of the present invention relates to providing an antenna for plasma generation, a plasma processing apparatus, and a plasma processing method for supplying a microwave and gas.

Means for Solving the Problem

According to one embodiment of the present invention, an antenna for plasma generation is provided that is configured to generate surface wave plasma by radiating a microwave transmitted through a coaxial waveguide into a processing chamber and propagating the microwave on a metal surface of the processing chamber to convert a gas into plasma. The antenna for plasma generation includes a gas flow path configured to pass the gas through the antenna for plasma generation, a plurality of gas holes that communicate with the gas flow path and are configured to introduce the gas that has passed through the gas flow path into the processing chamber, and a plurality of slots that are separated from the gas flow path and penetrate through the gas flow path. The plurality of slots are configured to pass the microwave that has been transmitted through a slow-wave plate via the coaxial waveguide and radiate the microwave into the processing chamber. Adjacent slots of the plurality of slots are arranged such that a first space between portions of the adjacent slots penetrating through the gas flow path is wider than a second space between portions of the adjacent slots opening out to a plasma generation space of the processing chamber.

According to another embodiment of the present invention, a plasma processing apparatus is provided that includes a gas supply source configured to supply gas, a microwave output unit configured to output microwave power, and an antenna for plasma generation configured to generate surface wave plasma using the microwave output from the microwave output unit. The antenna for plasma generation includes a gas flow path configured to pass the gas through the antenna for plasma generation, a plurality of gas holes that communicate with the gas flow path and are configured to introduce the gas that has passed through the gas flow path into the processing chamber, and a plurality of slots that are separated from the gas flow path and penetrate through the gas flow path. The plurality of slots are configured to pass the microwave that has been transmitted through a slow-wave plate via a coaxial waveguide and radiate the microwave into the processing chamber. Adjacent slots of the plurality of slots are arranged such that a first space between portions of the adjacent slots penetrating through the gas flow path is wider than a second space between portions of the adjacent slots opening out to a plasma generation space of the processing chamber.

According to another embodiment of the present invention, a plasma processing method is provided that uses a plasma processing apparatus including an antenna for plasma generation configured to generate surface wave plasma. The antenna for plasma generation includes a gas flow path configured to pass gas through the antenna for plasma generation, a plurality of gas holes that communicate with the gas flow path and are configured to introduce the gas that has passed through the gas flow path into the processing chamber, and a plurality of slots that are separated from the gas flow path and penetrate through the gas flow path. The plurality of slots are configured to pass a microwave that has been transmitted through a slow-wave plate via a coaxial waveguide and radiate the microwave into the processing chamber. Adjacent slots of the plurality of slots are arranged such that a first space between portions of the adjacent slots penetrating through the gas flow path is wider than a second space between portions of the adjacent slots opening out to a plasma generation space of the processing chamber. The plasma processing method includes the steps of supplying the gas from an outer periphery side of the plurality of slots, passing the gas through a region of the gas flow path positioned between the portions of the adjacent slots disposed apart by the first space, introducing the gas to an inner periphery side of the plurality of slots, radiating the microwave into the processing chamber from the plurality of slots, propagating a surface wave of the microwave on a metal surface of the processing chamber, and converting the gas introduced into the processing chamber into plasma.

Advantageous Effect of the Invention

According to an aspect of the present invention, an antenna for plasma generation, a plasma processing apparatus, and a plasma processing method may be provided for supplying a microwave and gas.

EMBODIMENTS FOR IMPLEMENTING THE INVENTION

Figure 1:
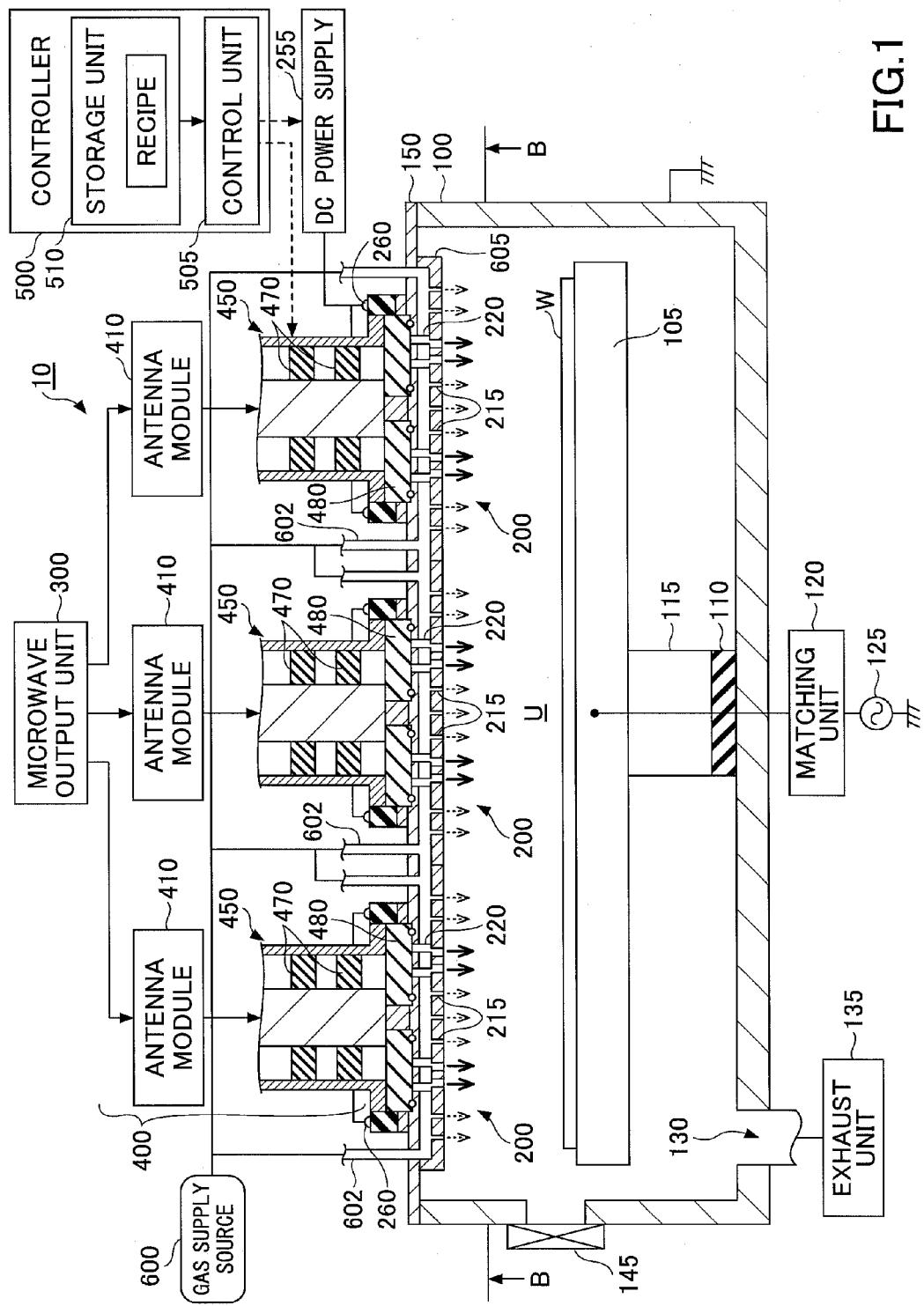
FIG. 1 illustrates an overall configuration of a plasma processing apparatus according to an embodiment of the present invention.

In the following, embodiments of the present invention are described with reference to the accompanying drawings. Note that elements having substantially the same functions or features may be given the same reference numerals and overlapping descriptions thereof may be omitted.

[Overall Configuration of Plasma Processing Apparatus]

First, an overall configuration of a plasma processing apparatus 10 according to an embodiment of the present invention is described with reference to FIG. 1. FIG. 1 is a longitudinal cross-sectional view of the plasma processing apparatus 10 according to the present embodiment.

The plasma processing apparatus 10 of the present embodiment is configured as a plasma etching apparatus for performing an etching process as a plasma process on a semiconductor wafer W (simply referred to as "wafer W" hereinafter). The plasma processing apparatus 10 includes a substantially cylindrical airtight processing chamber 100 in which a plasma process is performed on the wafer W. The processing chamber 100 is made of a metal such as aluminum and is grounded.

A mounting table 105 on which the wafer W is placed is arranged at a bottom portion of the processing chamber 100. The mounting table 105 is supported by a support member 115 and is arranged at the bottom portion of the processing chamber 100 via an insulator 110. In this way, the mounting table 105 may be in an electrically floating state. The mounting table 105 and the support member 115 may be made of aluminum having an alumite-processed (anodically oxidized) surface, for example.

A high frequency power supply 125 for biasing is connected to the mounting table 105 via a matching unit 120. The high frequency power supply 125 is configured to apply a high frequency power for biasing to the mounting table 105 so that ions within plasma may be drawn towards the wafer W. Although not shown, components such as an electrostatic chuck for electrostatically attracting the wafer W, a temperature control mechanism, a gas flow path for supplying a heat transfer gas to a bottom surface of the wafer W, and elevation pins that may be raised and lowered to transfer the wafer W are arranged at the mounting table 105.

An exhaust port 130 is arranged at the bottom portion of the processing chamber 100. The exhaust port 130 is connected to an exhaust unit 135 including a vacuum pump. By operating the gas exhaust unit 135, air within the processing chamber 100 may be discharged and the pressure within the processing chamber may be reduced to a desired vacuum level. A gate valve 145 for loading/unloading the wafer W is arranged at a sidewall of the processing chamber 100.

An antenna 200 for plasma generation that is capable of introducing gas and supplying microwaves from a same plane (simply referred to as "antenna 200" hereinafter) is arranged at a lid part 150 forming a ceiling portion of the processing chamber 100. A microwave transmitting mechanism 400 for transmitting a microwave is connected to an upper part of the antenna 200.

The microwave transmitting mechanism 400 includes an antenna module 410 and a microwave introducing mechanism 450. A microwave output from a microwave output unit 300 is transmitted to the antenna 200 via the antenna module 410 and the microwave introducing mechanism 450.

(Antenna Configuration)

Figure 2:
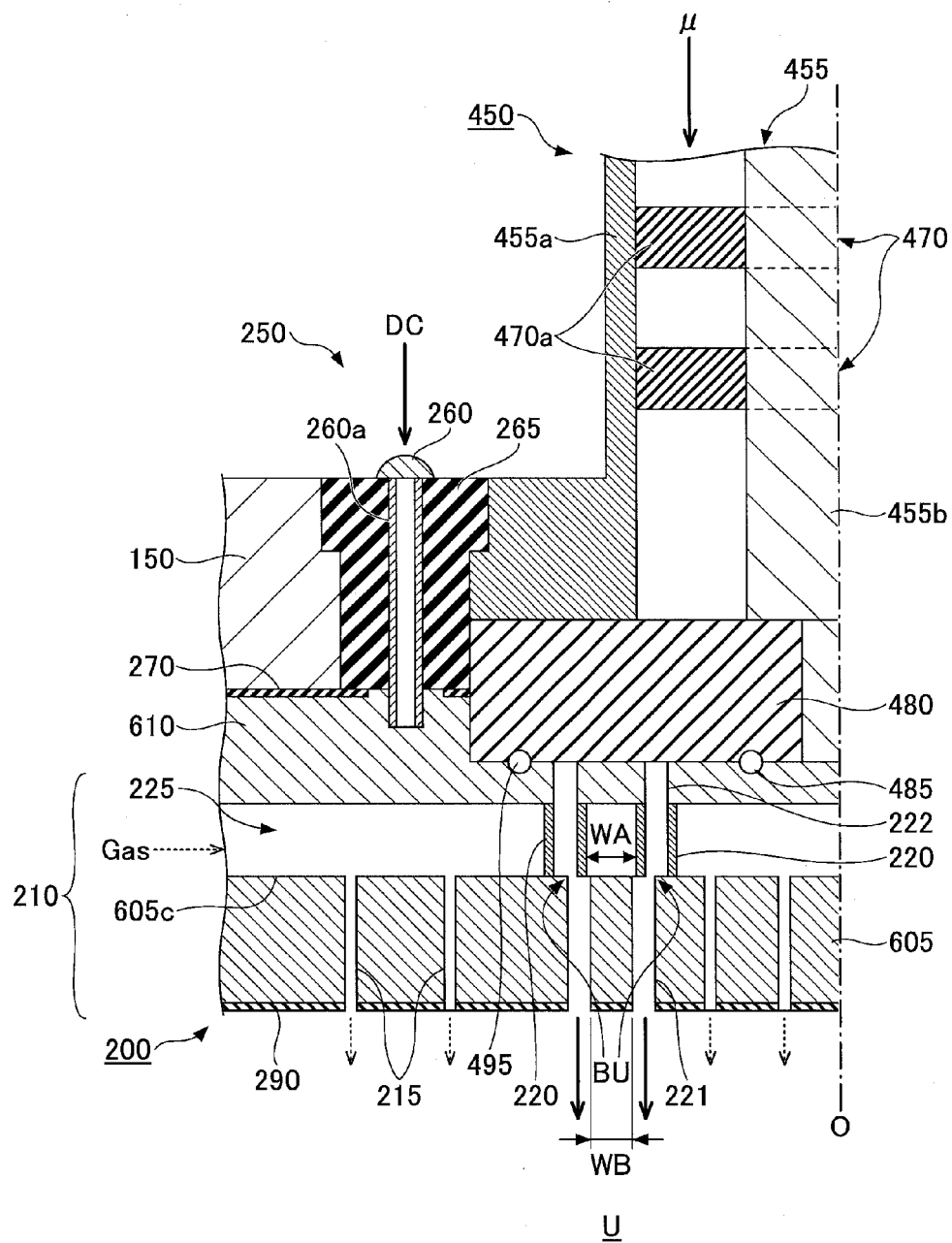
FIG. 2 illustrates an overall configuration of an antenna for plasma generation according to the embodiment.

In the following, configurations of the microwave introducing mechanism 450 and the antenna 200 are described with reference to FIG. 2. FIG. 2 is an enlarged view of the microwave introducing mechanism 450 and the antenna 200 (left half).

The microwave introducing mechanism 450 includes a waveguide having a coaxial structure for transmitting microwaves (referred to as "coaxial waveguide 455" hereinafter). The coaxial waveguide 455 includes an inner conductor 455b arranged at a power supply side and an outer conductor 455a arranged at a ground side. The antenna 200 is arranged at a lower end of the coaxial waveguide 455 via a slow-wave plate 480. The slow-wave plate 480 is formed by a disc-shaped dielectric member. A microwave travels through the coaxial waveguide 455 and passes through the slow-wave plate 480 to be introduced into the antenna 200.

A tuner 470 is arranged at the coaxial waveguide 455. The tuner 470 is a slug tuner including two slugs 470a. The slugs 470a are dielectric materials arranged into disc shapes. The slugs 470a are arranged annularly between the outer conductor 455a and the inner conductor 455b. The tuner 470 is configured to perform impedance adjustment by vertically moving the slugs 470a with an actuator (not shown) based on a command from a controller 500 illustrated in FIG. 1. The controller 500 may be configured to adjust the impedance such that a terminal impedance of the coaxial waveguide 455 reaches 50Ω, for example, to thereby maximize the microwave output.

The antenna 200 includes a shower head (gas shower head) 210 and a DC applying mechanism 250 for applying a direct current to the shower head 210. The shower head 210 is arranged to abut onto a bottom surface of the slow-wave plate 480. The shower head 210 is arranged into a disc shape and is made of a conductive material having high electric conductivity such as aluminum or copper, for example. The shower head 210 is exposed to a plasma generation space U of the processing chamber 100, and a surface wave is propagated on a bottom surface of the showerhead 210.

The shower head 210 includes a gas flow path 225, a plurality of gas holes 215 communicating with the gas flow path 225, and a plurality of slots 220 that are separated from the gas flow path 225 and the plurality of gas holes 215. The plurality of slots 220 include waveguides that are configured to pass microwaves that have been transmitted through the coaxial waveguide 455 and the slow-wave plate 480 and radiate the microwaves into the processing chamber 100. The plurality of slots 220 have stepped portions arranged at the waveguides that penetrate through the gas flow path 225. In the present embodiment, the plurality of slots 220 have stepped portions BU formed at an upper face 605c of a bottom member 605 of the shower head 210 corresponding to an interfacial boundary between the gas flow path 225 and the plurality of gas holes 215. In the following descriptions, a space between adjacent slots 220 at portions penetrating through the gas flow path 225 is referred to as "space WA" (corresponding to a first space), and a space between the adjacent slots 220 at portions opening out to a plasma generation space U of the plasma processing chamber 100 is referred to as "space WB" (corresponding to a second space). The space WA between the adjacent slots 220 at the portions penetrating through the gas flow path 225 is arranged to be wider than the space WB between the adjacent slots 220 at the portions opening out to the plasma generation space U of the processing chamber 100.

The gas flow path 225 is separated from the plurality of slots 220 and forms a space for enabling gas to flow through the antenna 200. The plurality of gas holes 215 communicate with the gas flow path 225 and are configured to introduce gas that has passed through the gas flow path 225 into the processing chamber 100. A face of the shower head 210 that is exposed to plasma may be covered by a spray coating film 290 made of plasma resistant material such as alumina ($Al_2O_3$) or yttrium oxide ($Y_2O_3$), for example, so that the conductor face may not be exposed to the plasma generation space U. Note that openings communicating with the plurality of slots 220 and the plurality of gas holes 215 are formed on the spray coating film 290.

O-rings 485 and 495 are arranged at a contact face between the showerhead 210 and the slow-wave plate 480 to vacuum seal the processing chamber 100 and the showerhead 210 from the microwave transmitting mechanism 400, which is arranged at the atmosphere side. In this way, the slots 220, the gas flow path 225, the gas holes 215, and the interior of the processing chamber 100 may be maintained under a state of vacuum.

The controller 500 illustrated in FIG. 1 controls operations such as applying a DC voltage to the antenna 200 and executing a plasma process within the plasma processing apparatus 10, for example. The controller 500 includes a control unit 505 and a storage unit 510. The control unit 505 controls the voltage applied to the antenna 200 and the power output from microwaves in each process according to a recipe stored in the storage unit 510, for example. A command to the controller 500 may be implemented by a dedicated control device or a CPU (not shown) configured to execute a program, for example. A recipe specifying various process conditions is stored in a ROM or a non-volatile memory (not shown) and the CPU reads the process conditions of the recipe from the memory to execute a corresponding process.

In the case where the shower head 210 is made of a conductive material as in the present embodiment, a DC voltage may be applied to the shower head 210. That is, according to a command issued by the control unit 505, a DC voltage output from a DC power supply 255 (see FIG. 1) is supplied to the DC applying mechanism 250 (see FIG. 2). The DC applying mechanism 250 includes a DC electrode 260, an insulating member 265, and an insulating sheet 270. The DC electrode 260 includes a cylindrical conductor 260a and is electrically connected to the shower head 210 via the conductor 260a. In this way, a DC voltage may be applied to the shower head 210. The DC electrode 260 may be screwed to the shower head 210 via an insulating socket (not shown) arranged at the bottom end of the conductor 260a, for example.

The DC electrode 260 is arranged close to the outer conductor 455a of the coaxial waveguide 455 and the lid part 150. Thus, the DC electrode 260 has to be electrically isolated from the outer conductor 455a, and the DC electrode 260 has to be electrically isolated from the lid part 150. Accordingly, the DC electrode 260 is covered by an insulating member 265 to isolate the DC electrode from the outer conductor 455a and the lid part 150. Further, an insulating sheet 270 is arranged between the shower head 210 and the lid part 150. By electrically isolating the DC electrode 260 from the outer conductor 455a and electrically isolating the DC electrode 260 from the lid part 150 in the manner described above, the DC voltage may only be applied to the shower head 210. In this way, application of the DC voltage may be restricted to desired component elements.

As can be appreciated, in the present embodiment, while a DC voltage is applied to the shower head 210, a microwave may be applied to the same shower head 210. In this way, the plasma processing apparatus 10 may be used to execute various processes. For example, when a microwave is applied to the shower head 210, a surface wave is propagated on a surface of the shower head 210. In this case, a sheath region is generated on the surface of the shower head 210 and the surface wave is propagated within the sheath region. The DC voltage may be used to control the thickness of the sheath. For example, when a DC voltage is applied to the shower head 210, the sheath may be controlled to be thicker, and as a result, the propagating distance of the surface wave propagating on the surface of the shower head 210 may be lengthened. By manipulating the plasma sheath voltage by controlling the DC voltage in the manner described above, the propagating distance of the surface wave may be controlled and an electron density distribution, an ion density distribution, and a radical density distribution of plasma may be optimized, for example.

Note that in a case where the shower head 210 is made of an insulating material, a DC voltage may not be applied to the shower head 210. In this case, an RF voltage may be applied to the shower head 210 to achieve effects similar to those obtained by applying a DC voltage as described above.

As can be appreciated from above, in the plasma processing apparatus 10 as illustrated in FIG. 1 and FIG. 2, a microwave introduced from the coaxial waveguide 455 penetrates through the slow-wave plate 480 and passes through the plurality of slots 220 of the shower head 210 to be radiated into the processing chamber 100. In this case, a metal surface wave corresponding to a standing wave having a wavelength characterized by a diffusion coefficient with the plasma sheath as a boundary condition is generated on the surface of the shower head 210 and absorbed by surface wave plasma. Gas supplied from a gas supply source 600 (see FIG. 1) flows through a gas supply pipe 602 and passes through the gas flow path 225, which is arranged within the antenna 200 and separated from the plurality of slots 220. The gas then passes through the plurality of gas holes 215 to be introduced into the processing chamber 100. The openings of the plurality of slots 220 and the openings of the plurality of gas holes 215 are formed on the same plane. Thus, the gas and the microwave are supplied from the same ceiling plane. In this way, the gas flow may be easily controlled, plasma controllability may be improved by the surface wave of the microwave, and plasma with a low electron temperature and a high plasma density may be generated. The generated surface wave plasma may be used in an etching process on the wafer W. Because the surface wave plasma has a low electron temperature, the wafer W may be less vulnerable to damage. Also, because the surface wave plasma has a high plasma density, the processing speed may be increased. Further, because the shower head 210 is made of a conductive material, processes such as reactive ion etching may be performed.

In a typical surface wave plasma technique, the antenna 200 is made of a dielectric material and the shower head is fabricated by mechanically processing the dielectric material. In this case, because microwaves penetrate through dielectric materials, gas may turn into plasma within the dielectric material and electrical discharge may occur as a result. Accordingly, it has been difficult to adopt a shower head structure in a typical surface wave plasma technique. For example, with respect to argon plasma, if a 10-mm-space is formed within a shower head, when a voltage of approximately 120 volts is applied to the shower head, abnormal electrical discharge is prone to occur within the shower head that is under a pressure of approximately 1 Torr (133 Pa).

In contrast, in the plasma processing apparatus 10 according to the present embodiment, the shower head 210 is made of a conductive material. Accordingly, a microwave cannot penetrate through the shower head 210. Thus, gas does not turn into plasma within the shower head 210 and no electrical discharge occurs within the shower head 210. Also, in the shower head 210 according to the present embodiment, a path for gas and a path for the microwave are completely separated, and as a result, the gas and the microwave do not come into contact with each other within the shower head 210. That is, the gas and the microwave come into contact with each other for the first time when they enter the processing chamber 100. Thus, by using the plasma processing apparatus 10 according to the present embodiment, loss of microwave power due to the occurrence of electrical discharge within the gas holes 215 and abnormal electrical discharge may be prevented.

As illustrated in FIG. 2, the plurality of slots 220 are separated from the gas flow path 225 and the plurality of gas holes 215. The plurality of slots 220 include upper portions 222 that penetrate through an upper part of the shower head 210 in the longitudinal direction. The plurality of slots 220 further penetrate through the gas flow path 225 while maintaining their separation from the gas flow path 225. The plurality of slots 220 further include the stepped portions BU, and lower portions 221 that penetrate through the bottom member 605 of the shower head 210 in the longitudinal direction. In this way, the slots 220 form waveguides for passing microwaves. Also, ends of the slots 220 on one side are arranged to abut the slow-wave plate 480, and the ends of the slots 220 at the other side open out to the plasma generation space U.

Figure 3:
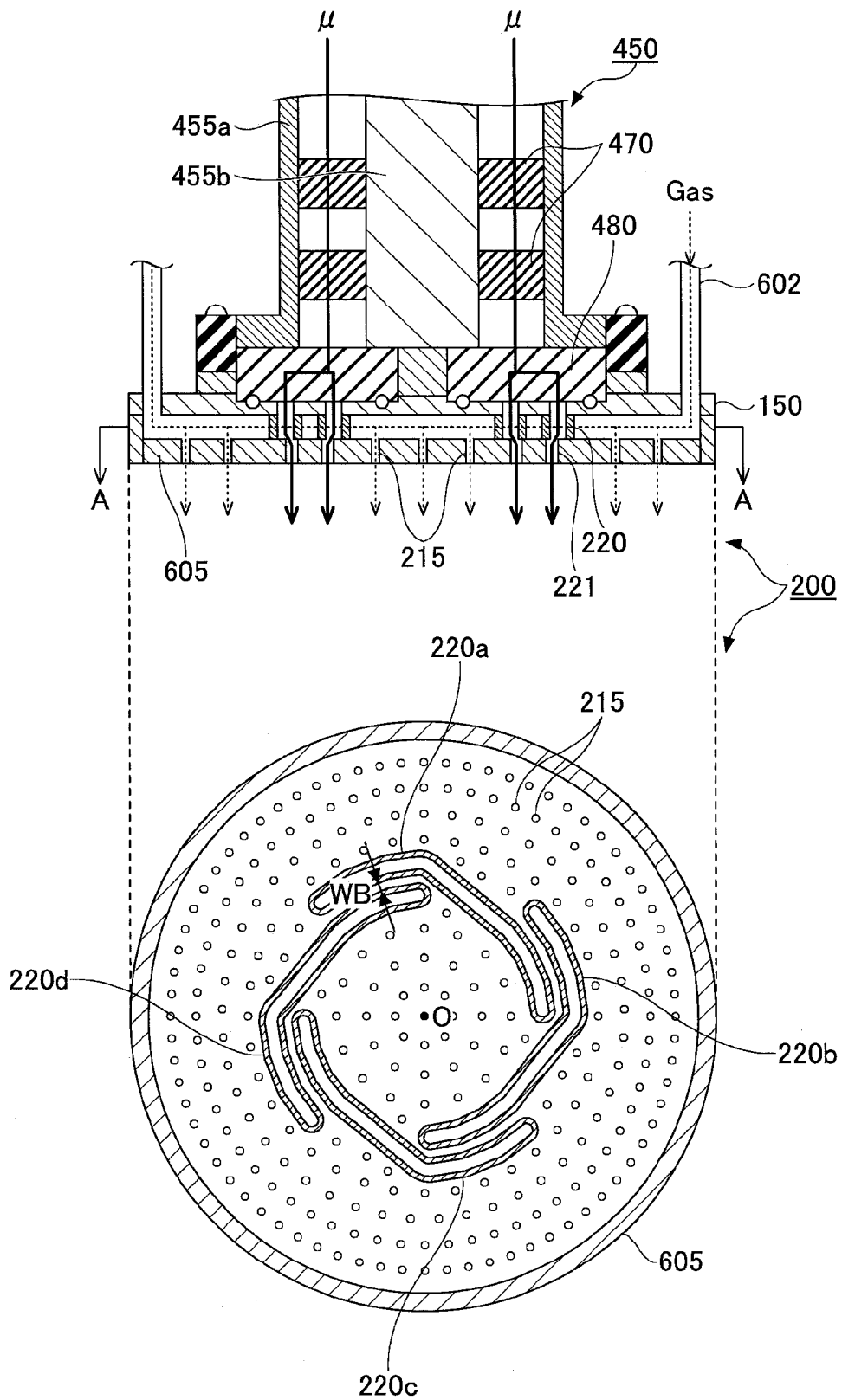
FIG. 3 illustrates a bottom plan view of the antenna for plasma generation according to the embodiment.

In FIG. 3, a longitudinal cross-sectional view of the microwave introducing mechanism 450 and the antenna 200 is illustrated at the upper side, and at the lower side of FIG. 3, a lateral cross-sectional view along line A-A of the longitudinal cross-sectional view at the upper side is illustrated. The plurality of slots 220 are arranged such that their longer sides extend along the circumferential direction of the shower head 210. Adjacent slots 220 are disposed apart by a predetermined space in the radial direction and are arranged to overlap with each other in the circumferential direction. In the illustrated example, four slots 220a-220d are evenly arranged in the circumferential direction. However, the number of slots 220 is not limited to four as long as at least two slots 220 are arranged within the shower head 210. In the illustrated example, the plurality of slots 220 are arranged symmetrically with respect to a central axis O of the antenna 200.

A cooling path (not shown) for cooling the shower head 210 is arranged within the shower head 210. Because the shower head 210 is made of a conductive material having high electric conductivity and the slot for passing the microwave is divided into a plurality of slots 220, heat from the plurality of slots 220 corresponding to microwave transmission paths that are easily heated may be efficiently discharged to the processing chamber 100 side. Note that the configuration and arrangement of the slots 220 are described below.

The gas holes 215 are evenly formed along the inner and outer periphery sides of the slots 220 arranged along the circumferential direction. In this way, gas introduced from the plurality of gas holes 215 may be turned into plasma by the microwave power supplied from the plurality of slots 220 having openings arranged on the same plane as the openings of the gas holes 215. In this way, plasma may be uniformly generated.

(Microwave Output Unit and Microwave Transmitting Mechanism)

In the following, configurations of the microwave output unit 300 and the microwave transmitting mechanism 400 are described with reference to FIG. 4.

Figure 4:
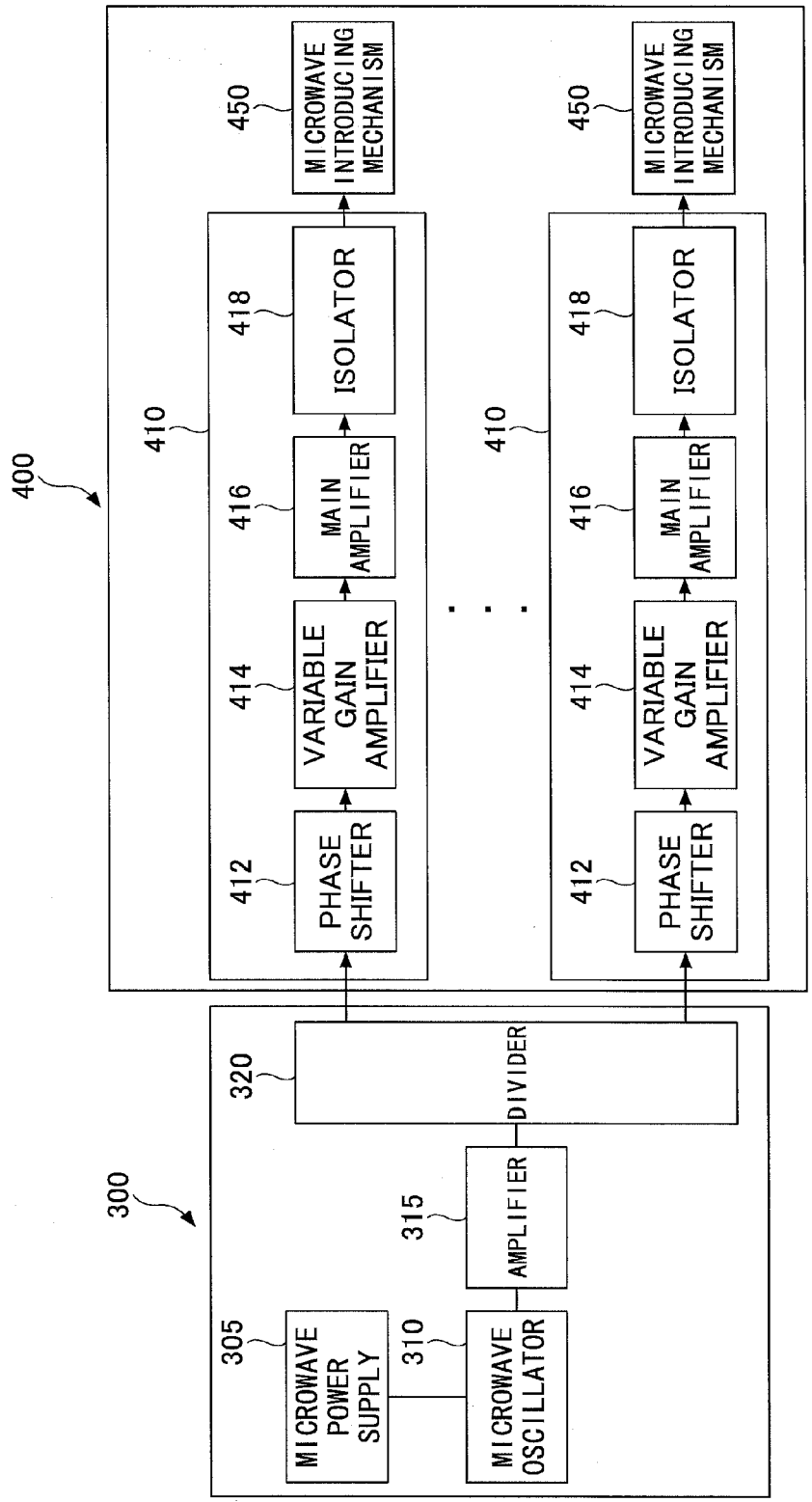
FIG. 4 is a block diagram illustrating configurations of a microwave output unit and a microwave transmitting mechanism according to the embodiment.

In FIG. 4, the configuration of the microwave output unit 300 is illustrated on the left side and the configuration of the microwave transmitting mechanism 400 is illustrated on the right side.

The microwave output unit 300 includes a microwave power supply 305, a microwave oscillator 310, an amplifier 315, and a divider 320. The microwave power supply 305 outputs a microwave with a frequency of 8.35 GHz, 5.8 GHz, 2.45 GHz, 1.98 GHz, or lower, for example. The microwave oscillator 310 performs PLL (Phase Locked Loop) oscillation for a microwave of a predetermined frequency (e.g., 2.45 GHz). The amplifier 315 amplifies the microwave that has been oscillated. The divider 320 divides the amplified microwave into a plurality of microwaves. The divider 320 divides the microwave amplified by the amplifier 315 while matching the impedance between an input side and an output side such that the loss of the microwave can be minimized. The divided microwaves are transmitted to the antenna modules 410. In the present embodiment, seven antenna modules 410 are provided.

The antenna module 410 includes a phase shifter 412, a variable gain amplifier 414, a main amplifier 416, and an isolator 418. The antenna module 410 is configured to transmit a microwave output from the microwave output unit 300 to the microwave introducing mechanism 450.

The microwaves transmitted by the antenna modules 410 are radiated into the processing chamber 100 via the coaxial waveguides 455 that are connected to the antenna modules 410. The microwaves are then spatially synthesized within the processing chamber 100. The isolator 418 may be a small isolator that may be arranged next to the main amplifier 416, for example.

The phase shifter 412 is configured to shift a phase of the microwave using the slug tuner (tuner 470). By adjusting the phase of the microwave using the phase shifter 412, radiation characteristics of the microwaves may be modulated. For example, by adjusting the phase in each of the antenna modules 410, directional characteristics of the antenna modules 410 may be controlled to thereby change the plasma distribution. As another example, circularly polarized waves can be obtained by shifting the phase by about 90° between adjacent antenna modules 410. Note, however, that the phase shifter 45 need not be provided when it is unnecessary to modulate the radiation characteristics of the microwaves.

The variable gain amplifier 414 controls the power levels of the microwaves to be input to the main amplifier 416. Further, the variable gain amplifier 414 adjusts variations in the antenna modules 410 and the plasma intensity. By varying the variable gain amplifiers 414 of the antenna modules 410, a distribution may be created in the generated plasma, for example.

The main amplifier 416 corresponds to a solid state amplifier. The solid state amplifier may include, for example, an input matching circuit, a semiconductor amplifying device, an output matching circuit, and a high Q resonant circuit (not shown).

The isolator 418 is configured to separate the microwaves that are reflected by the antenna 200 and are directed toward the main amplifier 416. The isolator 418 includes a circulator and a dummy load (coaxial terminator). The circulator guides the microwave reflected by an antenna 200, and the dummy load converts the reflected microwave guided by the circulator into heat. In this way, a microwave output from the antenna module 410 is transmitted to the microwave introducing mechanism 450 and guide to the antenna 200.

[Slot Configuration]

Figure 5:
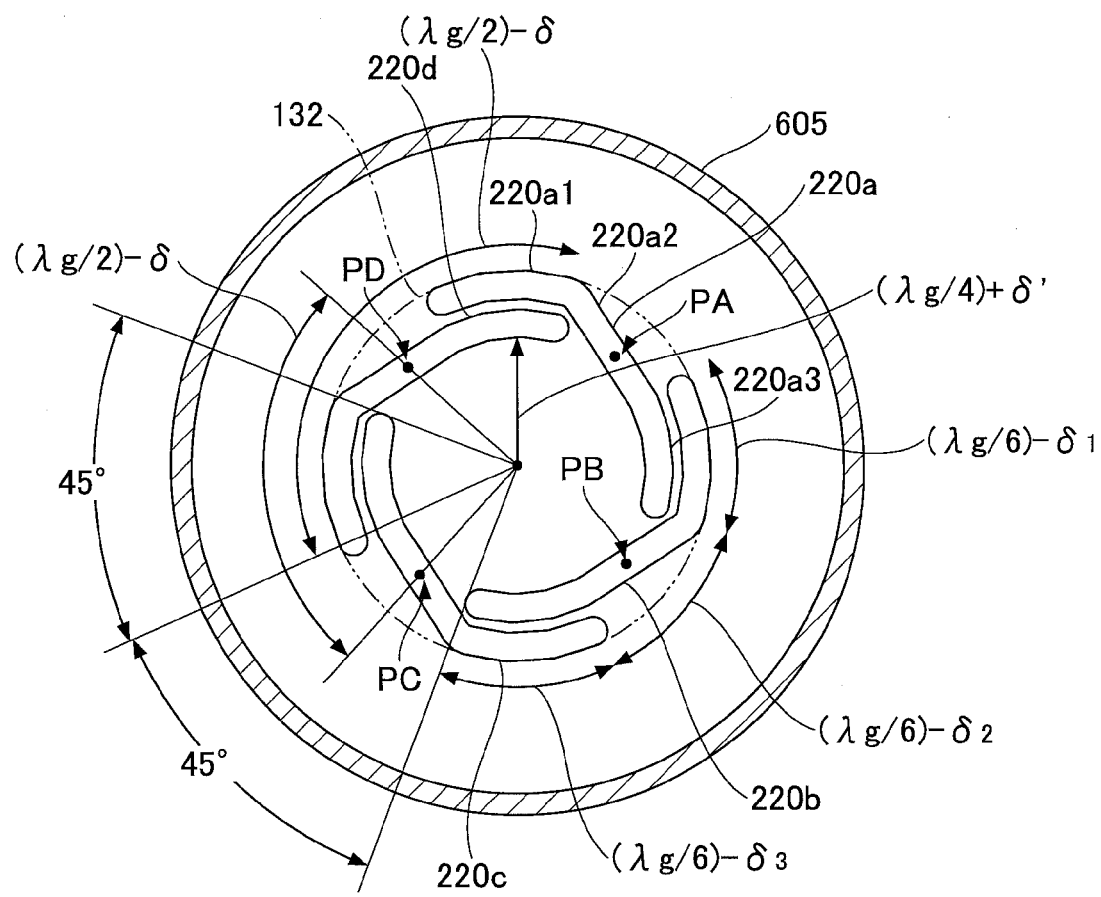
FIG. 5 illustrates an arrangement of a plurality of slots.

In the following, a configuration of the slots 220 and an electric field intensity distribution are described with reference to FIGS. 5 and 6. As illustrated in FIG. 5, in the present embodiment, four slots 220a-220d are evenly arranged in the circumferential direction. The slots 220a-220d have the same configurations and are arranged into elongated shapes that to extend in the circumferential direction. Also, in the present embodiment, the four slots 220a-220d are symmetrically arranged with respect to the central axis O of the antenna 200.

The four slots 220a-220d are arranged to have lengths of $(\lambda g/2)-\delta$ in the circumferential direction and are designed such that microwaves reach their electrical field intensity peaks at center positions PA, PB, PC, and PD of the slots 220a, 220b, 220c, and 220d. Note, however, that the lengths of the slots 220 in the circumferential direction is not limited to $(\lambda g/2)-\delta$ as long as they are equal to $n(\lambda g/2)-\delta$ (where n is an integer greater than or equal to 1). Further, as long as the slots 220 are arranged to have lengths of $n(\lambda g/2)-\delta$, the lengths of the slots 220 in the circumferential direction do not necessarily have to be uniform and may vary from slot to slot, for example.

Note that $\lambda g$ represents the waveguide wavelength (effective wavelength), and $\delta$ represents a fine adjustment component (including 0). The waveguide wavelength $\lambda g$ may be expressed as $\lambda_0/\sqrt{\in_r}$, where $\lambda_0$ represents the wavelength in free space, and $\in_r$ represents the dielectric constant of a dielectric member. For example, in a case where the dielectric member that is filled into the slot is quartz, the waveguide wavelength $\lambda g$ may be a value expressed by $\lambda_0/\sqrt{3.78}$. Note that the dielectric member that is filled into the slot is not limited to quartz but may be other dielectric materials such as alumina ($Al_2O_3$) and Teflon (registered trademark), for example.

Adjacent slots 220 are disposed apart by a predetermined space in the radial direction and overlap each other in the circumferential direction. Also, each slot 220 is arranged to overlap with an adjacent slot 220 at both sides. In this way, the slots 220 may be arranged along the entire circumferential direction and radiation characteristics in the circumferential direction may be arranged to be uniform. Note that the slots 220 all have the same configurations. Taking the slot 220a as an example, the slot 220a includes a left side outer portion 220a1, a center portion 220a2, and a right side outer portion 220a3 along the circumferential direction. The left side outer portion 220a1 overlaps with a right side outer portion of the adjacent slot 220d in the circumferential direction and is disposed apart from the right side outer portion of the adjacent slot 220d by a predetermined space in the radial direction. In the illustrated example, the left side outer portion 220a1 of the slot 220a is arranged at the outer periphery side, and the right side outer portion of the slot 220d is arranged at the inner periphery side. Similarly, the right side outer portion 220a3 of the slot 220a overlaps with a left side outer portion of the slot 220b in the circumferential direction and is disposed apart from the left side outer portion of the adjacent slot 220b by a predetermined space in the radial direction. In the present example, the right side outer portion 220a3 of the slot 220a is arranged at the inner periphery side and the left side outer portion of the slot 220b is arranged at the outer periphery side. The center portion 220a2 of the slot 220a does not overlap with another slot. In the present example, the left side outer portion 220a1, the center portion 220a2, and the right side outer portion 220a3 are each arranged to extend approximately 45 degrees along the circumferential direction.

The left side outer portion 220a1 and the right side outer portion 220a3 are substantially arc-shaped. On the other hand, the center portion 220a2 of the slot 220a has a substantially linear shape. The center portion 220a2 is arranged to connect the left side outer portion 220a1 positioned at the outer periphery side and the right side outer portion 220a3 positioned at the inner periphery side with respect to the center position PA.

Referring to slot 220b illustrated in FIG. 5, the lengths of the left side outer portion 220b1, the center portion 220b2, and the right side outer portion 220b3 of the slot 220b in the circumferential direction are $(\lambda g/6)-\delta_1$, $(\lambda g/6)-\delta_2$, and $(\lambda g/6)-\delta_3$, respectively. The above lengths are substantially equal, and $\delta_1$, $\delta_2$, and $\delta_3$ represent fine adjustment components (including 0). Note that uniformity of the electric field intensity distribution may be improved by arranging the overlapping portions of the adjacent slots 220 to be substantially equal. Accordingly, the fine adjustment components $\delta_1$, $\delta_2$, and $\delta_3$ are preferably arranged to be equal to each other. Also, note that in FIG. 6, which is described below, it is assumed that the fine adjustment components $\delta_1$, $\delta_2$, and $\delta_3$ are equal to 0 to simplify the illustrations.

The slots 220a-220d are arranged such that their inner peripheral sides are positioned at a distance of $(\lambda g/4)+\delta'$ from the central axis O of the antenna 200. Note that $\delta'$ represents a fine adjustment component (including 0) for making fine adjustments to achieve uniformity in the electric field intensity distribution in the radial direction. Also, note that the distance from the central axis O to the inner peripheral side of the slot 220 is not limited to $\lambda g/4$ but may be any whole-number multiple of $\lambda g/4$ with the fine adjustment component (including 0) added thereto.

Figure 6:
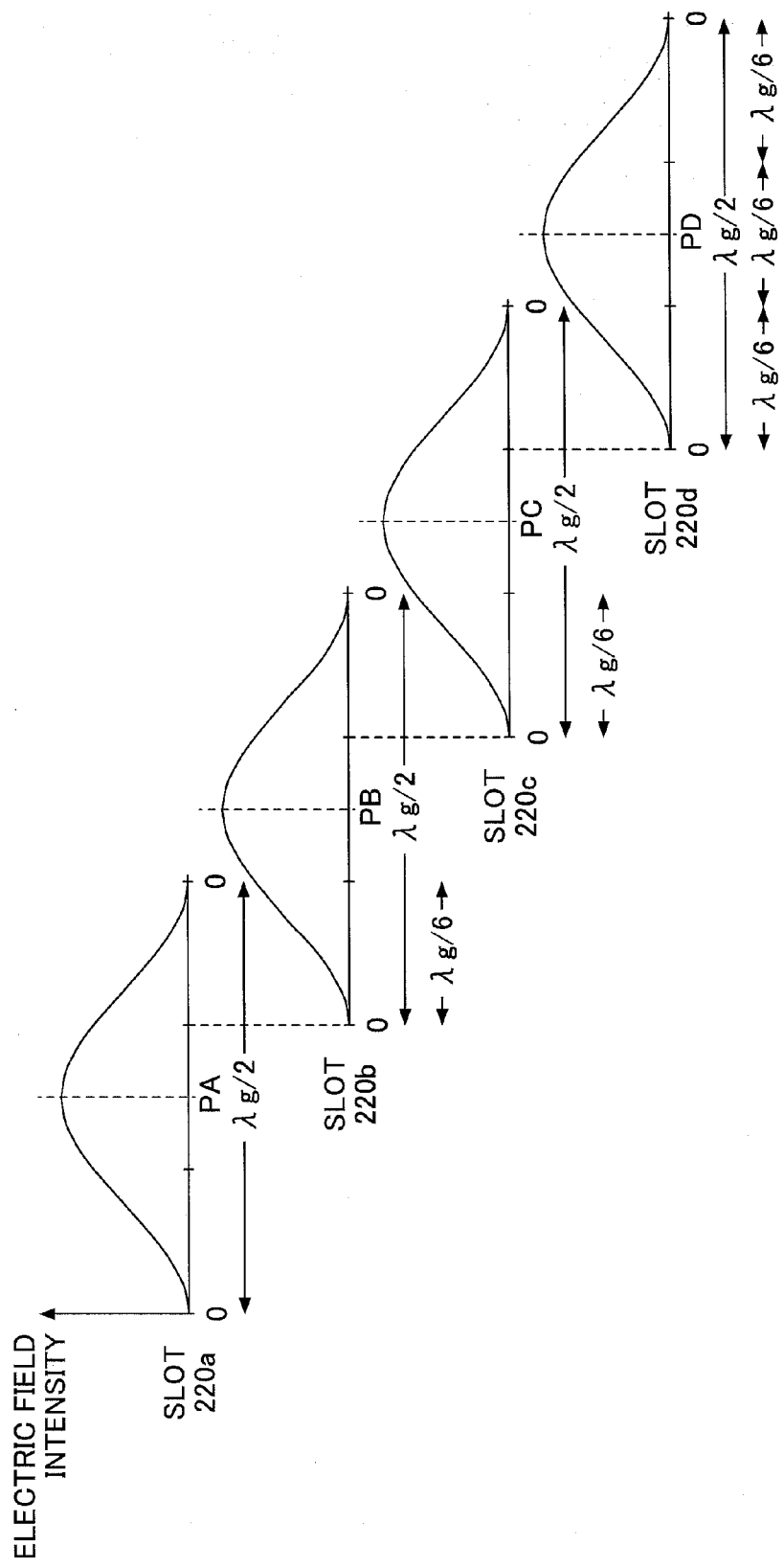
FIG. 6 illustrates a relationship between the arrangement of the plurality of slots and an electric field intensity distribution.

By implementing the slot configuration and arrangement as illustrated in FIG. 5, the power (electric field intensity) of microwaves may be arranged to peak at the center positions PA, PB, PC, and PD of the slots 220a, 220b, 220c, and 220d as illustrated in FIG. 6. That is, each of the plurality of slots 220 is designed to have a pitch of $\lambda g/2$ in the circumferential direction. Also, because each slot 220 is arranged to have a length of $\lambda g/2$ in the circumferential direction, the electric field intensity at the side ends of each slot is equal to 0. Accordingly, the electric field intensity at the center portion of the slot is strong, and the electric field intensities at the left side outer portion and the right side outer portion of the slot 220 are weak. Thus, adjacent slots 220 are arranged to overlap at the left side outer portions and the right side outer portions. In this way, the power of microwaves radiated from the left side outer portions and the right side outer portions of the slots 220 may be increased. As a result, uniformity may be achieved in the electric field intensity distribution at the center portions and outer portions of the slots 220. Also, with respect to the overlapping portions of the adjacent slots 220, the positional relationship between an outer periphery side slot and an inner periphery side slot and the positional relationship between a right side slot and a left side slot are arranged to be uniform throughout all overlapping portions of the plurality of slots 220. For example, when viewing the slots 220 clockwise, a right side slot is always arranged at the outer periphery side to overlap with a left side slot.

By implementing such slot configuration and arrangement, uniformity may be achieved in the electric field intensity distribution in the circumferential direction and the radial direction. In this way, desired microwave radiation characteristics and radiation uniformity may be achieved.

[Gas Flow Path]

Figure 7:
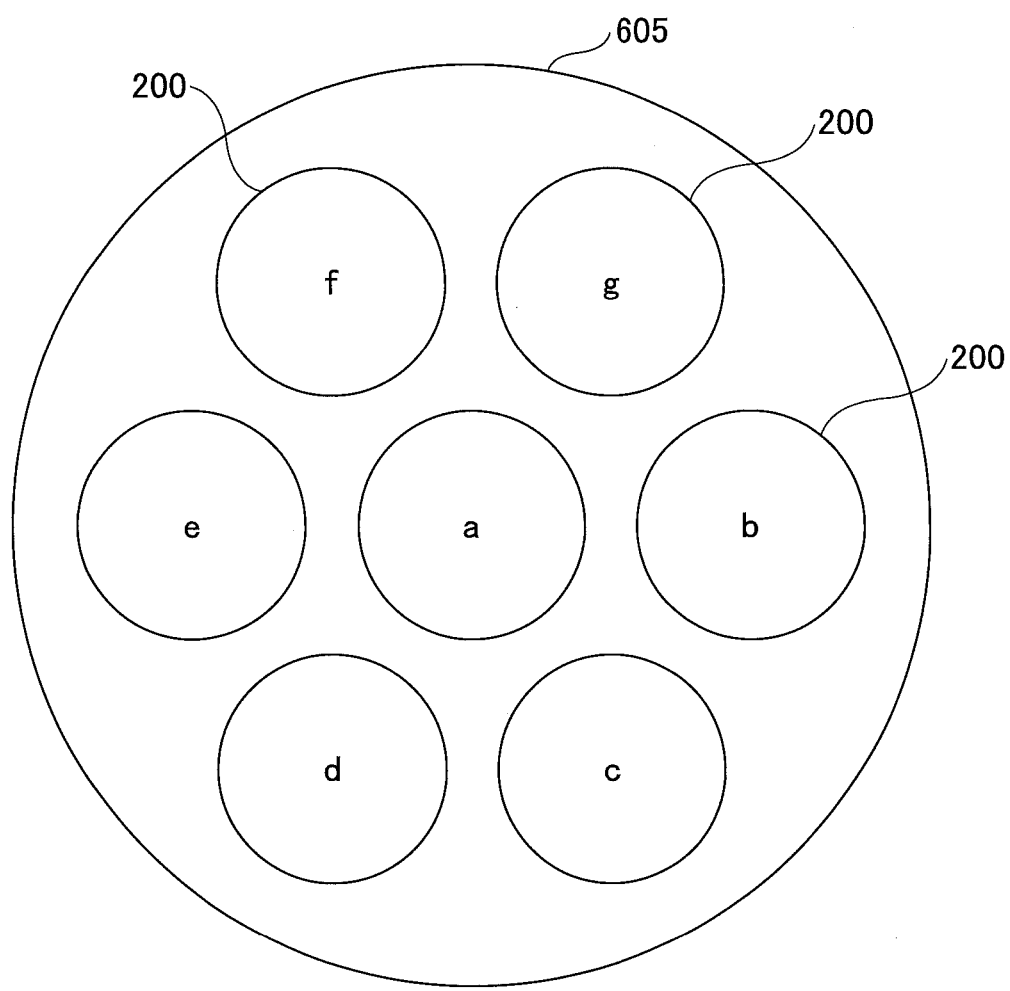
FIG. 7 illustrates gas flow rates of gas supplied from a ceiling of the plasma processing apparatus of the embodiment.

In the following, optimization of the gas flow path for the plurality of slots 220 arranged in the above manner is described. In the shower head 210, uniformity in the gas flow rate is desired in order to generate plasma in a uniform manner. However, in the case where the slots 220 and the gas flow path are separately arranged within the shower head 210, a passage way for gas may be restricted by the arrangement of the slots 220. Particularly, in a process requiring a relatively high total gas flow rate, uniformity of the gas flow rate may be compromised by the structure of the shower head 210. For example, in a process of forming a pattern and using the pattern as a mask to etch a lower layer using an oxygen-based etching gas to thereby form a trench, the pressure within the processing chamber may be 80 mTorr (10.6 Pa), and the gas types and gas flow rates used may be $C_4F_8/Ar/N_2/O_2=30/1200/70/23$ sccm. In this case, the total gas flow rate may reach approximately 1400 sccm. Thus, in the present embodiment, gas has to be evenly introduced into the processing chamber 100 at a uniform gas flow rate even in such a process. That is, while maintaining uniformity of the gas flow rate, gas at a maximum flow rate of approximately 1400 sccm has to be introduced into the processing chamber 100 from gas holes that are evenly arranged (see gas holes 215 illustrated in the cross-sectional view along line A-A of FIG. 3) at bottom faces a, b, c, d, e, f, and g of the seven antennas 200 arranged at the plasma processing apparatus 10 as illustrated in FIG. 7, which corresponds to a cross-sectional view along line B-B of FIG. 1. Note that when the angle or position of the slots 220 are altered to improve the uniformity of the gas flow rate, the microwave radiation characteristics and radiation uniformity may be compromised.

Figure 8:
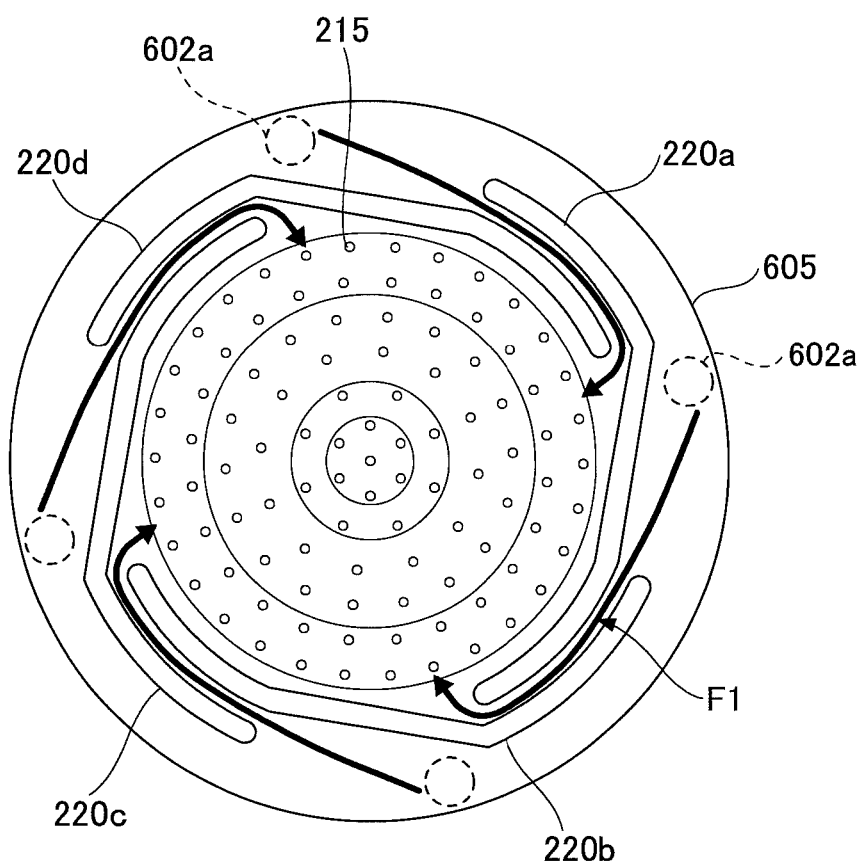
FIG. 8 illustrates a relationship between the arrangement of the plurality of slots and the gas flow rates.

In the present embodiment, as illustrated in FIG. 8, gas introduction ports 602a that are connected to the gas supply pipes 602 are arranged at the outer periphery side of the slots 220. That is, the gas introduction ports 602a are arranged at the outer periphery side of the slots 220 rather than the inner periphery side of the slots in order to reduce the risk of leakage of microwaves. Accordingly, gas is transported through the space between the overlapping portions of the slots 220 to the inner side of the slots 220 and introduced into the processing chamber 100 from the gas holes 215 that are arranged at the inner side of the slots 220. In this case, the passage way for gas at the overlapping portions of the slots 220 becomes narrow. An aspect of the present embodiment relates to configuring the shower head 210 to maintain uniformity of the gas flow rate even in such a case so that gas at a total flow rate of approximately 1400 sccm may flow smoothly to the gas holes 215 arranged at the inner side of the slots 220 to be introduced into the processing chamber 100 in a uniform manner.

[Stepped Portion of Slots]

Figure 9:
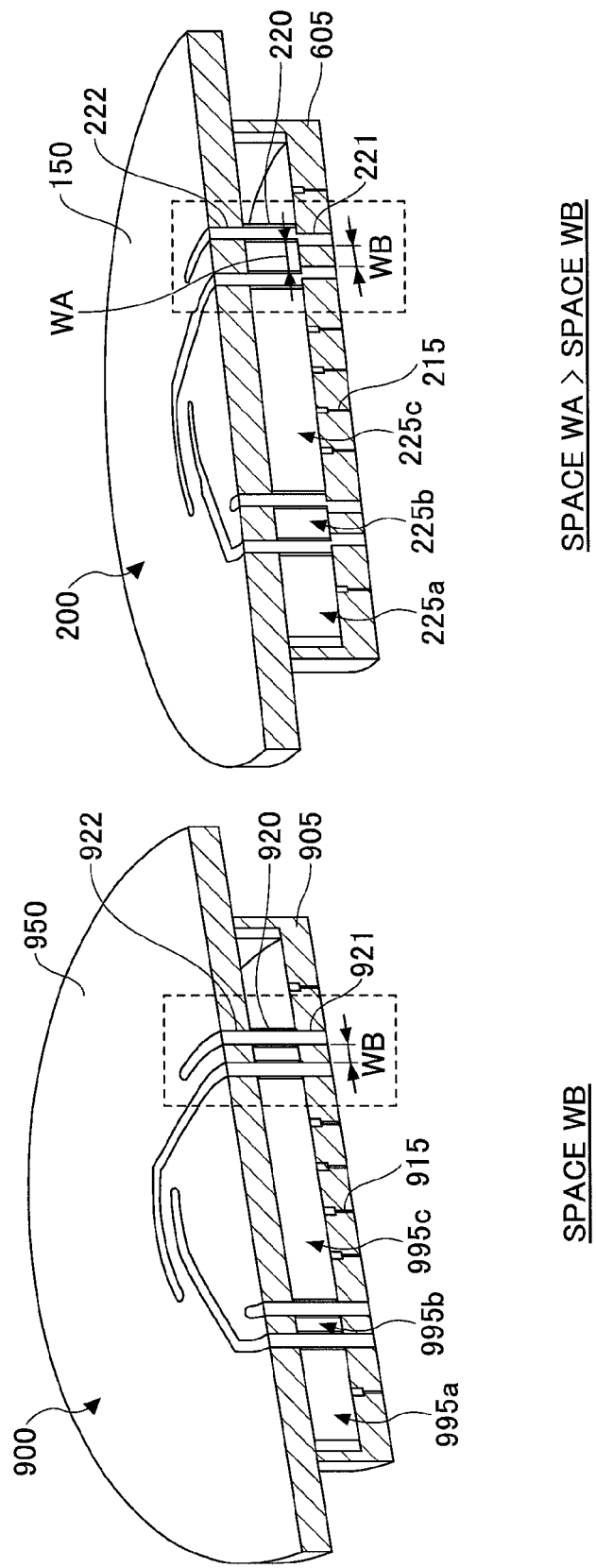
FIG. 9 illustrates two antennas for plasma generation.
Figure 10:
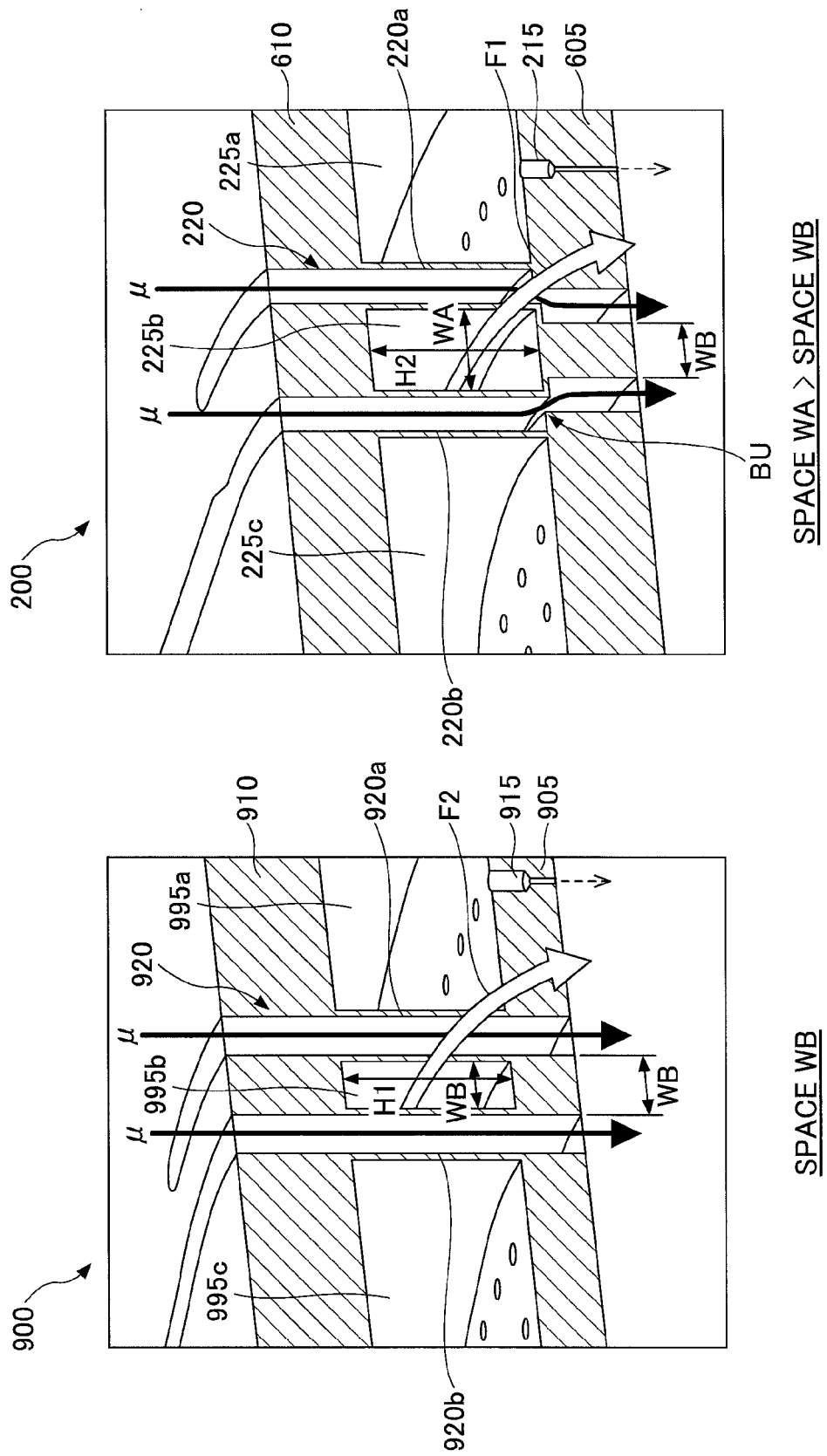
FIG. 10 illustrates partial enlarged views of stepped portions of the slots illustrated in FIG. 9.

In the shower head 210 according to the present embodiment, a stepped portion is arranged at the slot 220, which also acts as a waveguide. In this way, the shower head 210 is configured to increase gas conductance and maintain uniformity of the microwave radiation characteristics at the same time. In FIGS. 9 and 10, two different types of antennas for plasma generation are illustrated. In an antenna 900 for plasma generation illustrated at the left side of FIGS. 9 and 10 (simply referred to as "antenna 900" hereinafter), a space between portions of slots 920 that penetrate through a gas flow path is equal to a space WB between portions of the slots 920 opening out to the plasma generation space. On the other hand, in the antenna 200 illustrated at the right side of FIGS. 9 and 10, the space WA between the portions of the slots 220 that penetrate through the gas flow path 225 is wider than the space WB between the portions of the slots 200 opening out to the plasma generation space U. Note that in FIGS. 9 and 10, the space between portions of adjacent slots 220/920 of the antennas 200/900 opening out to the plasma generation space, and the space between the portions of adjacent slots 920 of the antenna 900 that penetrate through the gas flow path are all the same, and accordingly, these spaces are all referred to as space WB.

The two antennas 200 and 900 are described below with reference to FIGS. 9 and 10.

Radiation characteristics of microwaves radiated into plasma are determined by the slot configuration at a position where the slots come into contact with plasma (i.e., the slot configuration and arrangement illustrated in FIG. 5). The radiation characteristics of the microwaves are not affected by the waveguide configurations of the slots before reaching such contact position. That is, the microwave transmission characteristics may not be changed as long as the slot configuration and the space WB between the slots are maintained at the portions opening out to the plasma generation space U of the processing chamber 100. Thus, the waveguide configuration and structure of the slots 220 may be changed without causing a degradation of the microwave transmission characteristics. In the antennas 900 and 200, the configuration and arrangement of slot portions 921 and slot portions 221 respectively arranged at a bottom member 905 and the bottom member 605 of the shower heads of the antennas 900 and 200 are substantially the same, and the same space WB is provided between the slot portions 921 and the slot portions 221 opening out to the plasma generation space. In this way, radiation characteristics and radiation uniformity of microwaves radiated into the processing chamber 100 may be maintained.

On the other hand, to increase gas conductance, the waveguide configuration and structure are altered in the following manner. In the antenna 900, the plurality of slots 920 do not have stepped portions formed at the interfacial boundary between gas flow paths 995a, 995b, and 995c and a plurality of gas holes 915. Thus, in the antenna 900, the space WB between portions of adjacent slots 920 penetrating through the gas flow path (width of the gas flow path 995b) is equal to the space WB between the slot portions 921 opening out to the plasma generation space.

In contrast, in the antenna 200, the plurality of slots 220 has stepped portions formed at the interfacial boundary between gas flow paths 225a, 225b, and 225c and the plurality of gas holes 215. Thus, in the antenna 200, the space WA between portions of adjacent slots 220 penetrating through the gas flow path is wider than the space WB between portions of the adjacent slots 220 opening out to the plasma generation space.

FIG. 10 includes enlarged views of the stepped portions of the slots 220 of the antenna 200 and corresponding portions of the slots 920 of the antenna 900 illustrated in FIG. 9. Referring to FIG. 10, in the antenna 900, adjacent slots 920a and 920b penetrate perpendicularly through the bottom member 905 of the shower head without including any stepped portions. On the other hand, in the antenna 200, adjacent slots 220a and 220b has stepped portions BU formed at the interfacial boundary between the gas flow paths 225a, 225b, and 225c and the plurality of gas holes 215. That is, in the slot at the inner periphery side of the overlapping slots (slot 220b in the present example), the stepped portion BU is formed such that the slot protrudes toward the outer periphery side within the bottom member 605 of the shower head. In the slot at the outer periphery side of the overlapping slots (slot 220a in the present example), the stepped portion BU is formed such that the slot protrudes toward the inner periphery side within the bottom member 605 of the shower head.

By forming the stepped portions BU at the interfacial boundary between the gas flow path 225 and the plurality of gas holes 215, the space between overlapping portions of adjacent slots may be arranged so that the space WA between portions of the slots 220a and 220b penetrating through the gas flow path 225 (width of gas flow path 225b) is wider than the space WB between portions of the slots 220a and 220b opening out to the plasma generation space (width between portions of the slots 220a and 220b penetrating through the bottom member 605). In this way, the space WA of the gas flow path 225b of the antenna 200 may be arranged to be wider than the space WB of the gas flow path 995b of the antenna 900 illustrated in FIGS. 9 and 10, and the gas conductance may be increased in the antenna 200. As a result, uniformity of the gas flow rate may be improved at the antenna 200.

Note that, as illustrated in FIG. 8, in the antenna 200, gas is supplied from the gas introduction ports 602a arranged at the outer periphery side of the plurality of slots 220, and the gas is transported from the gas flow path 225a at the outer periphery side of the plurality of slots 220, through the gas flow path 225b between the slot portions spaced apart by space WA and overlapping with each other, to be supplied to the gas flow path 225c at the inner periphery side of the plurality of slots 220. Thus, the gas flow path 225b positioned between the slot portions overlapping with each other becomes relatively narrow, and such a structure may restrict the flow of gas. However, the overlapping configuration of the slots 220 and the space WB between portions of the slots 220 opening out to the plasma generation space are necessary for achieving desired microwave radiation characteristics.

Accordingly, by forming the stepped portions BU within the slots 220 as in the present embodiment to arrange the space WA of the gas flow path 225b to be wider than the space WB between the slot portions opening out to the plasma generation space U, gas conductance may be increased at the gas flow path 225b positioned between portions of the slots 220 overlapping with each other. That is, as illustrated in FIGS. 8 and 10, a gas flow rate F1 of gas passing through the gas flow path 225b is arranged to be greater than a gas flow rate F2 of gas passing through the gas flow path 995b (i.e., gas flow rate F1>gas flow rate F2). In this way, gas may be smoothly supplied from the gas flow path 225a at the outer periphery side of the plurality of slots 220 to the gas flow path 225c at the inner periphery side via the gas flow path 225b. Note that the gas holes 215 are arranged to have upper portions with diameters of approximately 1-1.5 mm and lower portions with diameters of approximately 0.5 mm in order to produce differential pressures.

The inventors of the present invention have confirmed through electromagnetic field simulation analysis that, despite the arrangement of the stepped portions BU in the waveguides of the slots, microwave radiation characteristics may be maintained and gas flow rate uniformity may be improved by implementing the slot arrangement according to the present embodiment.

Note that in the present embodiment, the width (space) between the slot portions overlapping with each other is widened by forming the stepped portions BU in the slots 220 to thereby increase the space of the gas flow path 225*b*. To increase the space of the gas flow path, a height H of the gas flow path between the overlapping slot portions may be increased. However, increasing the height H of the gas flow path may cause attenuation of the microwave power and is therefore preferably avoided. For example, if the height H is increased by 120%, the surface area of the gas flow path may be increased by 144%, but the microwave power may be reduced by 50%.

In the present embodiment, the microwave mode is TE10, which is a mode that allows microwaves to pass through slots with relative ease. Nevertheless, in a case where the height H of the gas flow path is increased, the microwave transmission path becomes longer and the microwave power is attenuated as a result. In a microwave mode of a higher order than TE10, attenuation of the microwave power may be even greater. As a result, the power of microwaves radiated into the processing chamber may be weakened. In light of the above, increasing the height H of the gas flow path is preferably avoided.

Also, with respect to the stepped portion BU, microwave transmission characteristics may not be degraded as long as a width difference created by the stepped portion is less than half (½) the lateral width of the slot. That is, the width of a narrowest portion of the slot created by the stepped portion may be 1-2 mm. Note that the slot width of portions of the slot other than the stepped portion may be 3-5 mm.

By using the shower head 210 having the above-described configuration, gas conductance may be increased and uniformity of microwave radiation characteristics may be maintained at the same time.

(Slot Modification)

Figure 11:
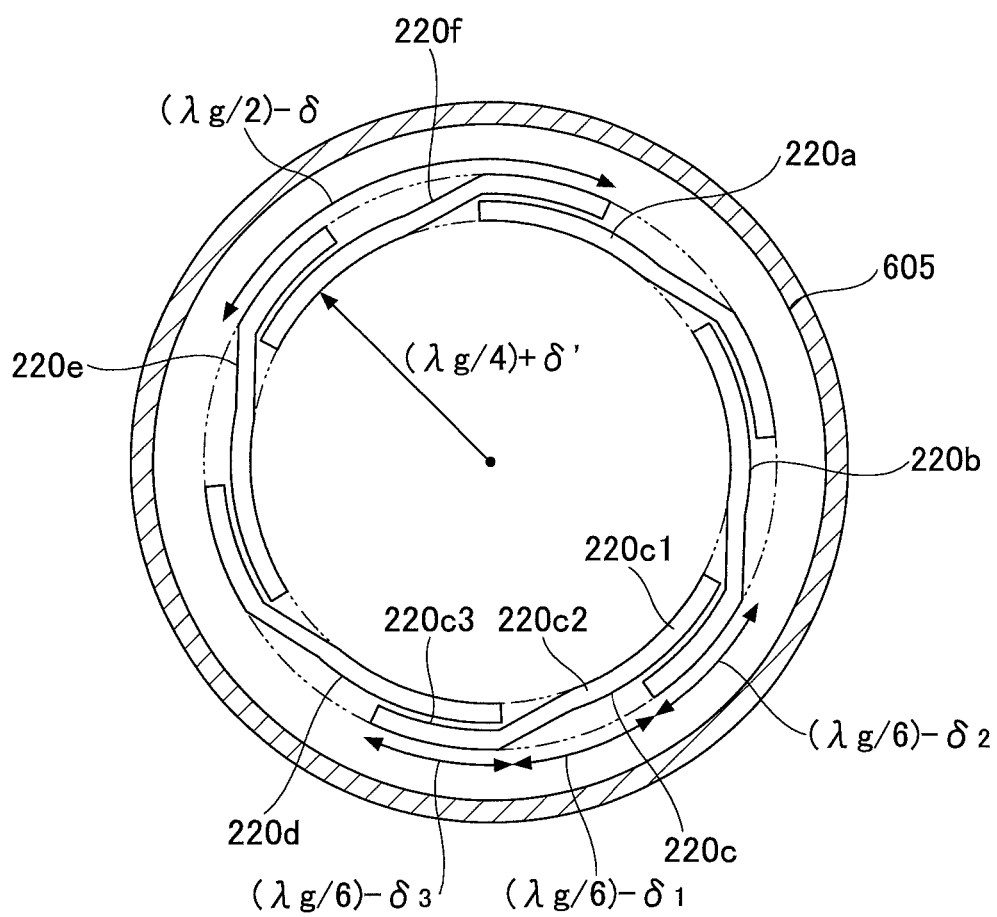
FIG. 11 illustrates an arrangement of a plurality of slots according to a modification of the embodiment.

FIG. 11 illustrates an arrangement of slots according to a modification of the present embodiment. The present modification differs from the above embodiment in that six slots are arranged. Note that even in the present modification, the length of the six slots 220*a*-220*f* in the circumferential direction is $\lambda g/2\delta$, and the slots 220*a*-220*f* are designed such that the electric field intensities of microwaves peak at the center positions of the slots 220*a*-220*f*. Note, however, that the length of the slot 220 in the circumferential direction is not limited to $\lambda g/2\delta$ but may be $n\lambda g/2\delta$ (where n is an integer greater than or equal to 1). Also, note that $\delta$ represents a fine adjustment component (including 0).

Adjacent slots 220 have overlapping portions disposed apart by a predetermined space in the radial direction. Each slot 220 overlaps with an adjacent slot 220 at both sides. Note that the slots 220 all have the same configuration. For example, the slot 220*c* includes a left side outer portion 220*c*1, a center portion 220*c*2, and a right side outer portion 220*c*3. The left side outer portion 220*c*1 overlaps with a right side outer portion of the slot 220*b* and is disposed apart from the right side outer portion of the slot 220*b* by a predetermined space in the radial direction. In the illustrated example, the left side outer portion 220*c*1 of the slot 220*c* is arranged at the inner periphery side and the right side outer portion of the slot 220*b* is arranged at the outer periphery side. Similarly, the right side outer portion 220*c*3 of the slot 220*c* overlaps with a left side outer portion of the slot 220*d* and is disposed apart from the left side outer portion of the slot 220*d* by a predetermined space in the radial direction. In the present example, the right side outer portion 220*c*3 of the slot 220*c* is arranged at the outer periphery side and the left side outer portion of the slot 220*d* is arranged at the inner periphery side. The center portion 220*c*2 of the slot 220*c* does not overlap with any other slot 220.

The lengths of the left side outer portion, the center portion, and the right side outer portion of the slots 220 in the circumferential direction are $(\lambda g/6)-\delta_2$, $(\lambda g/6)-\delta_1$, and $(\lambda g/6)-\delta_3$, respectively. The above lengths are substantially equal, and $\delta_1$, $\delta_2$, and $\delta_3$ represent fine adjustment components (including 0). The left side outer portion and the right side outer portion of the slots 220 are substantially arc-shaped and are interconnected by the center portion having a substantially linear shape.

[Antenna Modifications]

Figure 13:
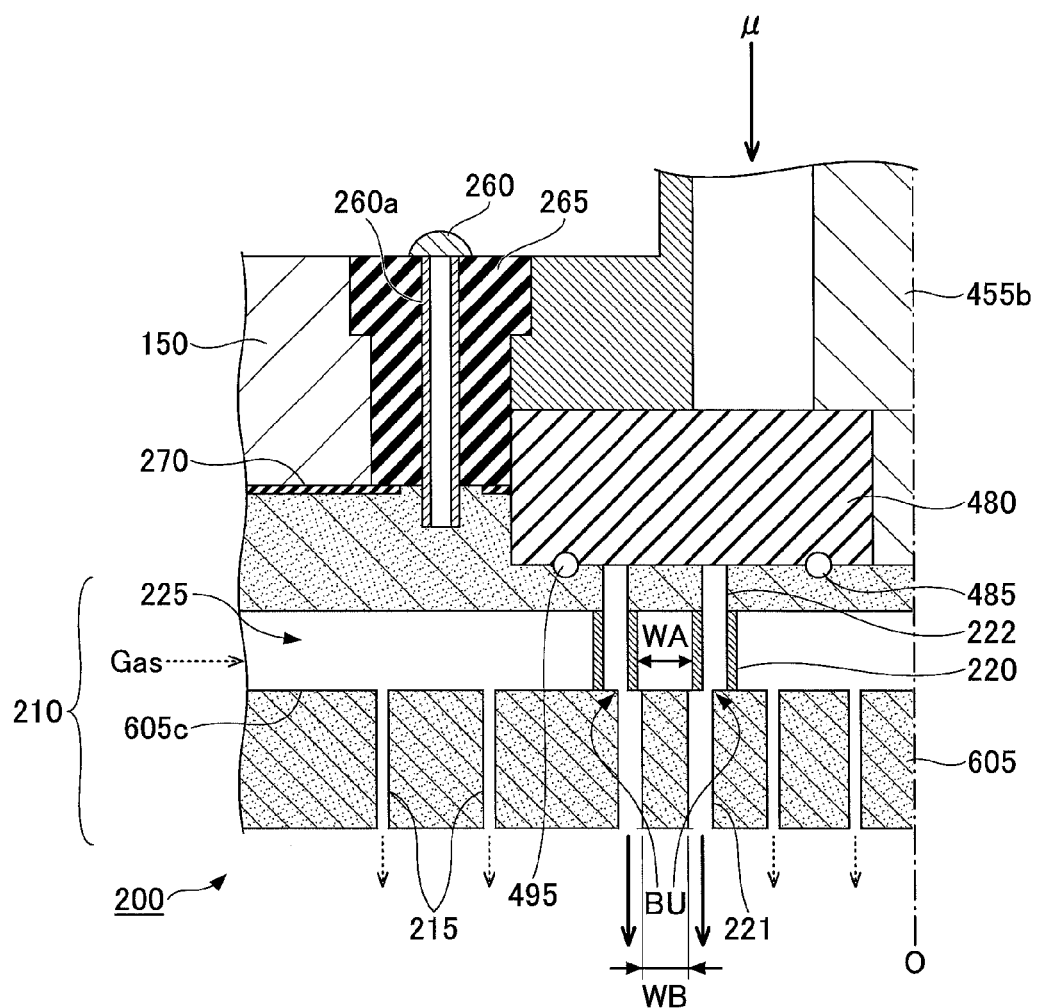
FIG. 13 illustrates a configuration of an antenna for plasma generation according to a second modification of the embodiment.
Figure 14:
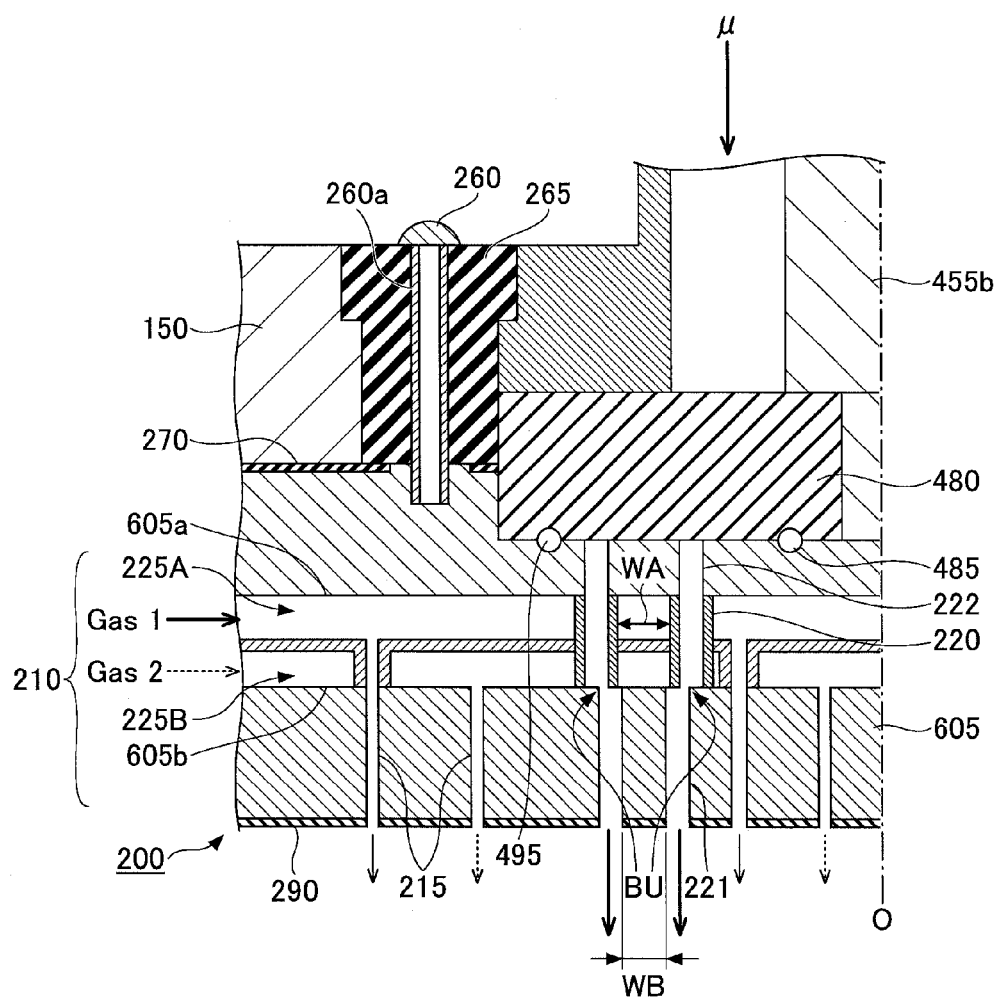
FIG. 14 illustrates a configuration of an antenna for plasma generation according to a third modification of the embodiment.

In the following, first through third modifications of the antenna 200 according to the above embodiment are described with reference to FIGS. 12-14.

(First Antenna Modification)

First, the antenna 200 according to a first modification of the embodiment is described below with reference to FIG. 12. The antenna 200 according to the first modification as illustrated in FIG. 12 may be used in the plasma processing apparatus 10 according to the present embodiment in place of the antenna 200 according to the embodiment described above, for example.

Figure 12:
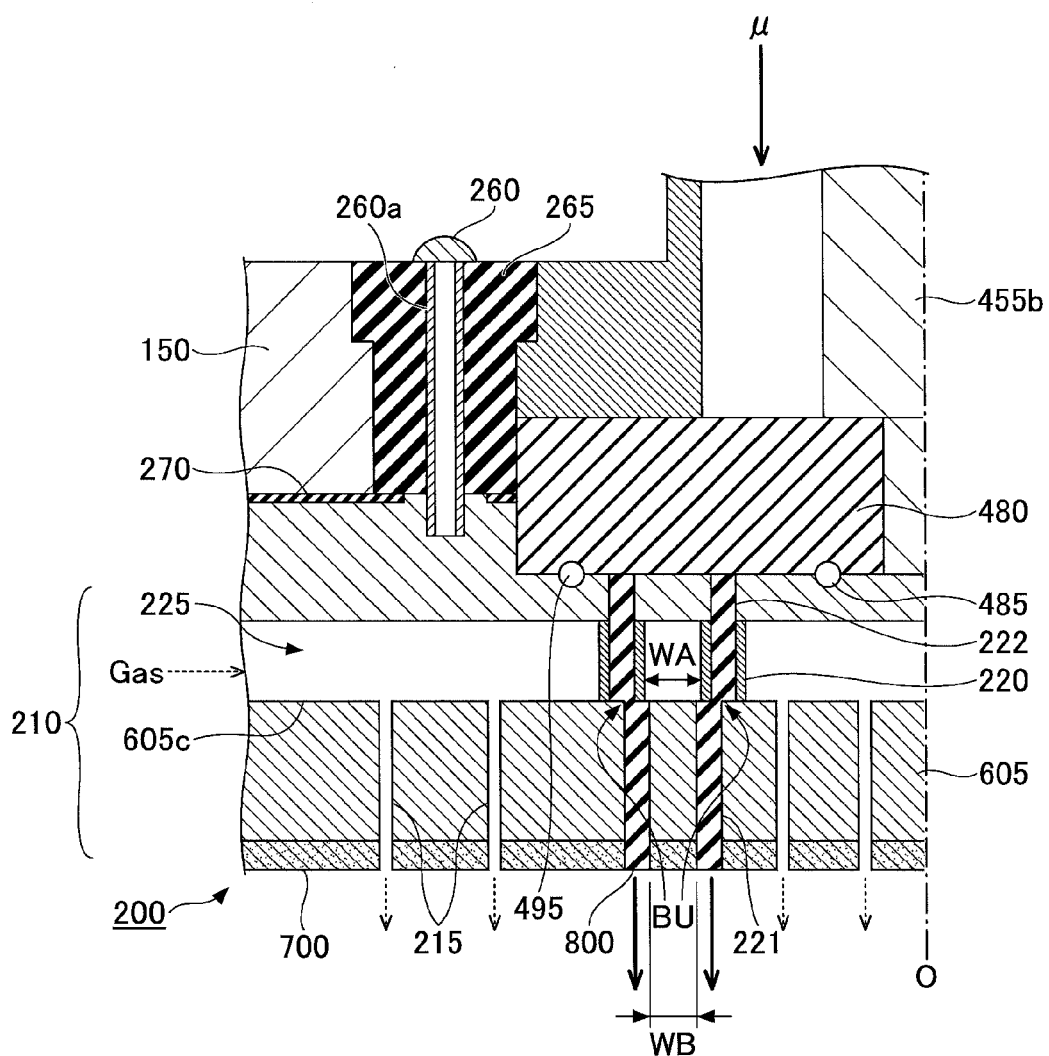
FIG. 12 illustrates a configuration of an antenna for plasma generation according to a first modification of the embodiment.

In the antenna 200 illustrated in FIG. 12, dielectric members 800 are filled into the plurality of slots 220. The dielectric member 800 may be made of quartz, for example. In this way, plasma may be prevented from entering the slots 220. Accordingly, abnormal electric discharge may be prevented and plasma uniformity may be improved at the same time. Further, by arranging the dielectric member 800 in the slots 220, the waveguide wavelength $\lambda g$ (effective wavelength) of the microwave passing through the slot 220 may be reduced. In this way, the thickness of the shower head 210 may be reduced.

Also, in the antenna 200 according to the first modification, a ceiling plate 700 made of silicon may be screwed to a bottom face (face exposed to the plasma generation space) of the shower head 210, which may be made of aluminum, for example. In this way, the ceiling plate 700, which may be damaged by plasma, may be replaced as is necessary, and the life of the shower head 210 may be extended. The ceiling plate 700 includes openings communicating with the gas holes 215 and the plurality of slots 220, and the dielectric members 800 are filled into the openings communicating with the slots 220 in the same manner as the slots 220.

(Second Antenna Modification)

Next, the antenna 200 according to a second modification of the embodiment is described with reference to FIG. 13. In the antenna 200 according to the second modification as illustrated in FIG. 13, the showerhead 210 is made of silicon. The antenna 200 according to the second modification may be used in the plasma processing apparatus 10 according to the present embodiment in place of the antenna 200 according to the embodiment described above, for example. Also, as illustrated in FIG. 13, the antenna 200 according to the second modification may be directly exposed to the plasma generation space without forming a thermal spray coating film on the shower head 210 or arranging the ceiling plate 700 as described above, for example.

Note that in both the first and second antenna modifications, microwaves may be radiated while applying a DC voltage to the shower head 210, and in this way, various processes may be executed.

(Third Antenna Modification)

Next, the antenna 200 according to a third modification the embodiment is described with reference to FIG. 14. In the antenna 200 according to the third modification as illustrated in FIG. 14, two gas flow path systems are provided. The antenna 200 according to the third modification may similarly be used in the plasma processing apparatus 10 of the present embodiment in place of the antenna 200 according to the embodiment described above, for example. In the antenna 200 according to the third modification, the gas flow path 225 is divided into gas flow path 225A and gas flow path 225B. Desired gas 1 may be output from the gas supply source 600 (see FIG. 1), passed through the gas flow path 225A and the gas holes 215, and introduced into the processing chamber 100 from the gas holes 215. Similarly, desired gas 2 may be output from the gas supply source 600 (see FIG. 1), passed through the gas flow path 225B and the gas holes 215 that are different from the gas holes 215 for passing gas 1, and introduced into the processing chamber 100 from the gas holes 215. In this way, different types of gases may be alternatingly introduced from adjacent gas holes 215. In the present modification, two gas flow systems may be controlled, and reaction (post-mixing) of two or more types of gases may be prompted within the processing chamber 100, for example. Note that the number of gas flow path systems provided in the antenna is not limited to two, and in other modified embodiments, three or more gas flow path systems may be provided so that three or more types of gases may be separately supplied to the processing chamber 100 without being mixed beforehand.

As can be appreciated, in the antenna 200 according to the present embodiment and the modifications described above, and in the plasma processing apparatus 10 using the antenna 200, gas and microwaves may be supplied from the same plane. That is, gas conductance may be increased and uniformity of the gas flow rate may be improved without degrading the radiation characteristics of the antenna 200. In this way, uniform plasma generation may be enabled under various process conditions so that various processes may be executed.

Note that the space between portions of the slots overlapping with each other at the gas flow path side (i.e., space WA illustrated in FIG. 10) may be designed to be 5-15 mm, for example.

Also, the stepped portion formed at the waveguide may be tapered as long as microwave transmission characteristics are not degraded.

Also, the gas holes 215 do not necessarily have to be uniformly arranged. For example, according to the differential pressure of the gas flow path 225 at the outer periphery side of the slots 220 and the inner periphery side of the slots 220, the diameters of the gas holes 215 arranged at the outer periphery side of the slots 220 may be designed to be smaller than the diameters of the gas holes 215 arranged at the inner periphery side of the slots 220.

Also, according to the differential pressure of the gas flow path 225 at the outer periphery side of the slots 220 and the inner periphery side of the slots 220, the number of the gas holes 215 arranged at the outer periphery side of the slots 220 may be designed to be less than the number of the gas holes 215 arranged at the inner periphery side of the slots 220.

Also, in the case where two types of gases are separately supplied to the processing chamber 100 from the gas holes 215 arranged at the outer periphery side of the slots 220 and the gas holes 215 arranged at the inner periphery side of the slots 220 to implement the so-called post-mixing, the gas flow rate of gas passing through the gas holes 215 arranged at the outer periphery side of the slots 220 may be designed to be different from the gas flow rate of gas passing through the gas holes 215 arranged at the inner periphery side of the slots 220 so as to separately control the gases.

<Concluding Remarks>

Although certain illustrative embodiments of an antenna for plasma generation, a plasma processing apparatus, and a plasma processing method according to the present invention are described above with reference to the accompanying drawings, the antenna for plasma generation, the plasma processing apparatus, and the plasma processing method according to the present invention are not limited to these embodiments. That is, numerous variations and modifications will readily occur to those skilled in the art, and the present invention includes all such variations and modifications that may be made without departing from the scope of the present invention. Also, embodiments and modifications of the present invention may be combined to the extent practicable.

Figure 15:
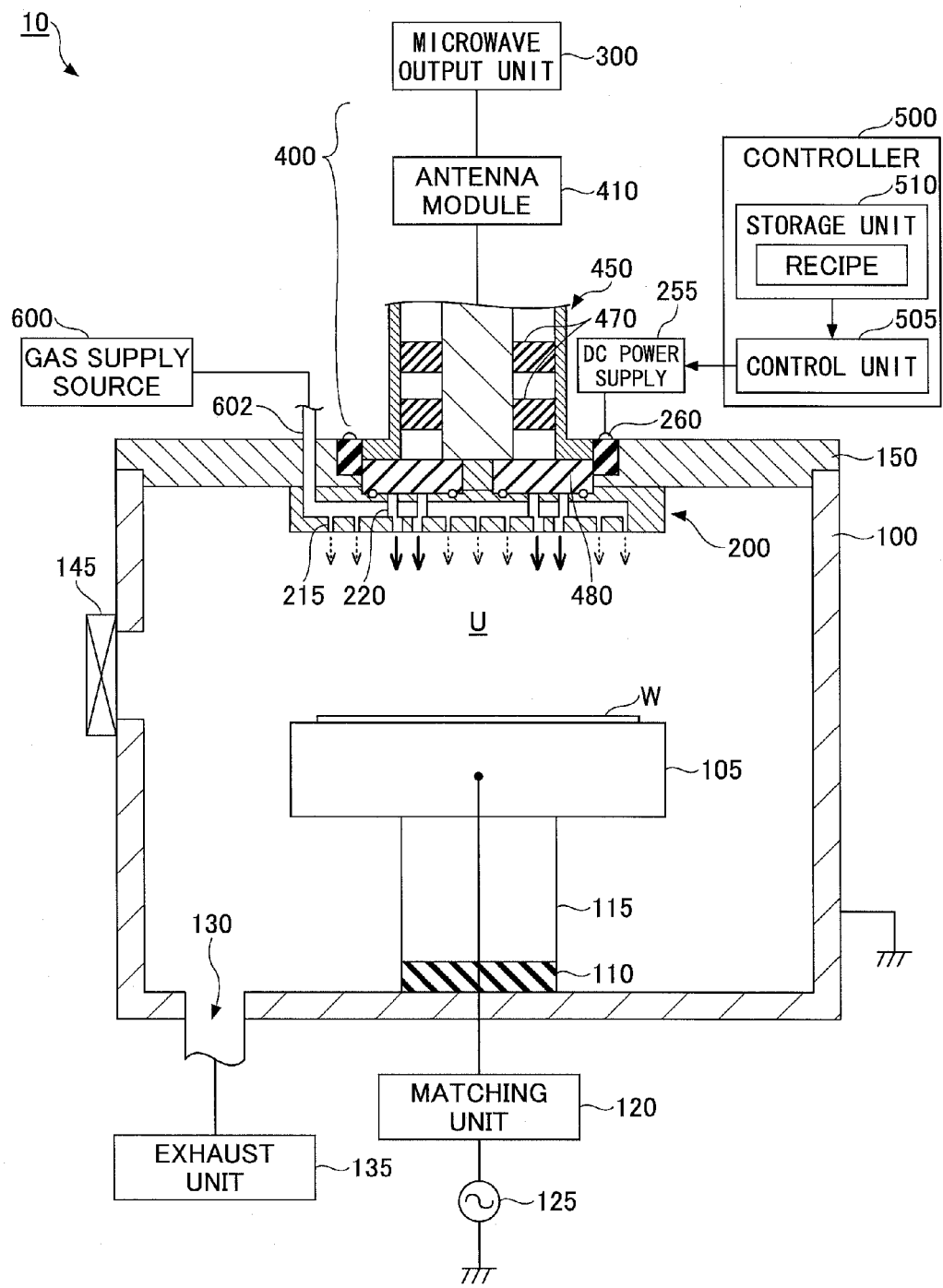
FIG. 15 illustrates an overall configuration of a plasma processing apparatus according to a modification of the embodiment.

For example, a plasma processing apparatus according to the present invention may have a single antenna 200 as illustrated in FIG. 15. FIG. 15 illustrates a schematic configuration of a plasma processing apparatus according to a modified embodiment. By providing a stepped portion in the slot 220 of the antenna 200 of the plasma processing apparatus illustrated in FIG. 15, gas conductance may be increased and uniformity of the gas flow rate may be improved without degrading the radiation characteristics of the antenna 200. In this way, uniform plasma generation may be achieved under various process conditions and various processes may be executed.

Figure 16:
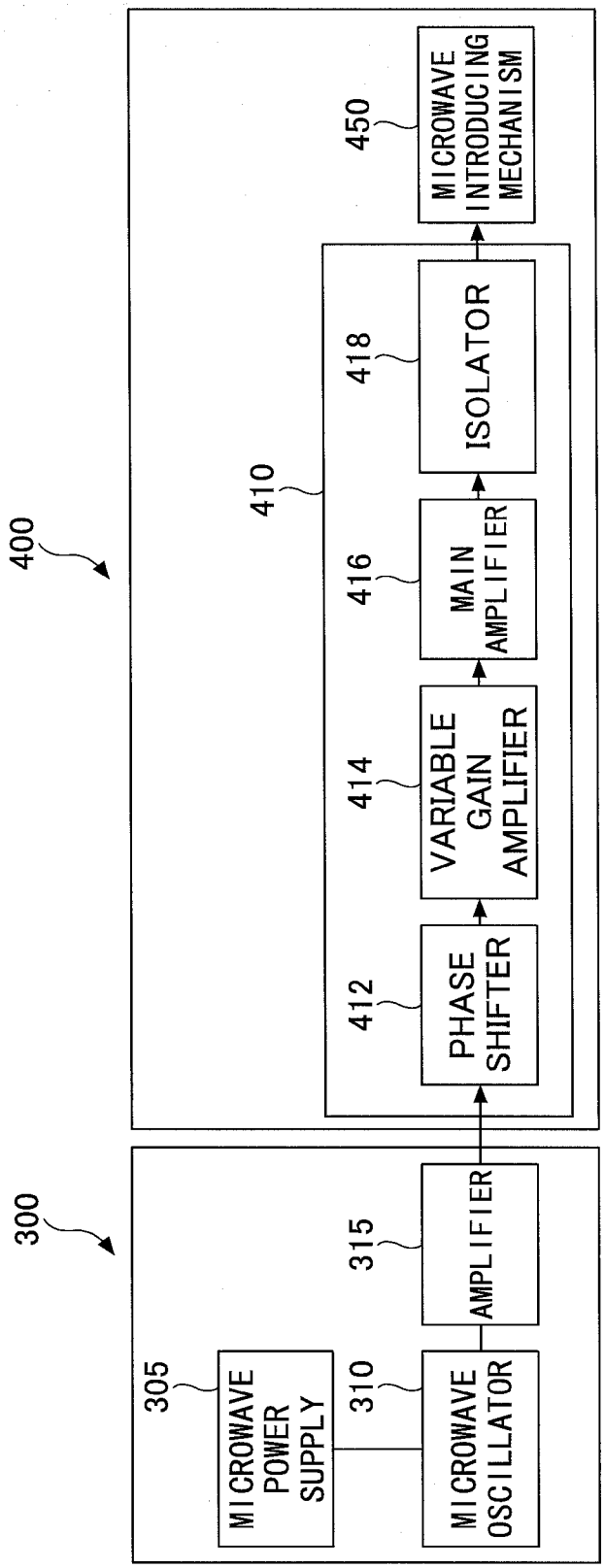
FIG. 16 illustrates configurations of a microwave output unit and a microwave transmitting mechanism according to a modification of the embodiment.

Also, the number of antennas 200 included in the plasma processing apparatus according to the present invention is not limited to a particular number. For example, FIG. 16 illustrates configurations of a microwave output unit and a microwave transmitting mechanism according to a modified embodiment. As illustrated in FIG. 16, in the case where the plasma processing apparatus has only one antenna 200, a divider 320 does not have to be provided in the microwave output unit 300. Also, the microwave transmitting mechanism 400 only needs one antenna module 410.

Also, the power supplied to the plasma processing apparatus of the present invention is not limited to a microwave, but may be any electromagnetic wave in a range from 100 MHz in the RF band to 3 GHz in the microwave band, for example.

Also, a plasma process that can be executed in the plasma processing apparatus according to the present invention is not limited to an etching process but may include other processes such as film formation, ashing, and sputtering, for example.

Further, according to one embodiment of the present invention, the plurality of slots may include waveguides that penetrate through the flow path and stepped portions arranged at the waveguides.

According to a further embodiment, the plurality of slots may have the stepped portions arranged at an interfacial boundary between the gas flow path and the plurality of gas holes.

According to another embodiment, the plurality of slots may have a dielectric material filled therein.

According to another embodiment, the plurality of slots may be arranged to extend longitudinally in the circumferential direction, and adjacent slots may be disposed apart by a predetermined space in the radial direction and overlap with each other in the circumferential direction. The predetermined space between the overlapping slots may be arranged such that a first space between portions of the overlapping slots penetrating through the gas flow path is wider than a second space between portions of the overlapping slots opening out to the plasma generation space.

According to another embodiment, the gas may be transported from the outer periphery side of the plurality of slots arranged along the circumferential direction and passed through a region of the gas flow path positioned between the portions of the overlapping slots disposed apart by the first space to be supplied to the inner periphery side of the plurality of slots.

According to another embodiment, a positional relationship between an inner periphery side slot and an outer periphery side slot of the adjacent slots and a positional relationship between a left side slot and a right side slot of the adjacent slots may be arranged to be uniform throughout all overlapping portions of the adjacent slots of the plurality of slots.

According to another embodiment, the plurality of slots may be evenly arranged in the circumferential direction.

According to a further embodiment, the plurality of slots may be arranged symmetrically with respect to a central axis of the antenna for plasma generation.

According to another embodiment, a pitch of the plurality of slots in a circumferential direction may be $n(\lambda g/2)-\delta$ (n being an integer greater than or equal to 1).

According to another embodiment, a length of the plurality of slots in a circumferential direction may be $n(\lambda g/2)-\delta$ (n being an integer greater than or equal to 1).

According to another embodiment, the first space between the portions of the overlapping slots penetrating through the gas flow path may be made wider than the second space between portions of the overlapping slots opening out to the plasma generation space of the processing chamber by stepped portions arranged within the overlapping slots at an interfacial boundary between the gas flow path and the plurality of gas holes.

According to another embodiment, each slot of the plurality of slots may include a left side outer portion, a center portion, and a right side outer portion, and each slot may be arranged to overlap with an adjacent slot of the plurality of slots at the left side outer portion and the right side outer portion.

According to another embodiment, the predetermined space between the overlapping slots may be arranged such that the first space between the portions of the overlapping slots penetrating through the gas flow path is 5-15 mm.

The present application is based on and claims the benefit of priority to Japanese Patent Application No. 2011-271435, filed on Dec. 12, 2011, and U.S. Provisional Application No. 61/576,042 filed on Dec. 15, 2011, the entire contents of which are hereby incorporated by reference herein.

DESCRIPTION OF THE REFERENCE NUMERALS 10 plasma processing apparatus
100 processing chamber
200 antenna for plasma generation
210 shower head
215 gas hole
220 slot
225 gas flow path
250 DC applying mechanism
300 microwave output unit
400 microwave transmitting mechanism
450 microwave introducing mechanism
455 coaxial waveguide
480 slow-wave plate
500 controller
600 gas supply source
605 bottom member of shower head
800 dielectric member
BU stepped portion

The invention claimed is:

1. An antenna for plasma generation that is configured to generate surface wave plasma by radiating a microwave transmitted through a coaxial waveguide into a processing chamber and propagating the microwave on a metal surface of the processing chamber to convert a gas into plasma, the antenna for plasma generation comprising:
a gas flow path configured to pass the gas through the antenna for plasma generation;
a plurality of gas holes that communicate with the gas flow path and are configured to introduce the gas that has passed through the gas flow path into the processing chamber; and
a plurality of slots that are separated from the gas flow path and penetrate through the gas flow path, the plurality of slots being configured to pass the microwave that has been transmitted through a slow-wave plate via the coaxial waveguide and radiate the microwave into the processing chamber;
wherein adjacent slots of the plurality of slots are arranged such that a first space between portions of the adjacent slots penetrating through the gas flow path is wider than a second space between portions of the adjacent slots opening out to a plasma generation space of the processing chamber.

2. The antenna for plasma generation as claimed in claim 1, wherein the plurality of slots include waveguides penetrating through the gas flow path and stepped portions arranged at the waveguides.

3. The antenna for plasma generation as claimed in claim 2, wherein the plurality of slots have the stepped portions arranged at an interfacial boundary between the gas flow path and the plurality of gas holes.

4. The antenna for plasma generation as claimed in claim 1, wherein
the plurality of slots are arranged to extend longitudinally in a circumferential direction;
the adjacent slots of the plurality of slots are disposed apart by a predetermined space in a radial direction and overlap with each other in the circumferential direction; and
the predetermined space between the overlapping slots includes the first space between portions of the overlapping slots penetrating through the gas flow path and the second space between portions of the overlapping slots opening out to the plasma generation space of the processing chamber, the first space being arranged to be wider than the second space.

5. The antenna for plasma generation as claimed in claim 4, wherein the gas is transported from an outer periphery side of the plurality of slots arranged in the circumferential direction, passed through a region of the gas flow path positioned between the portions of the overlapping slots disposed apart by the first space, and supplied to an inner periphery side of the plurality of slots.

6. The antenna for plasma generation as claimed in claim 4, wherein a positional relationship between an inner periphery side slot and an outer periphery side slot of the adjacent slots and a positional relationship between a right side slot and a left side slot of the adjacent slots are arranged to be uniform throughout all overlapping portions of the adjacent slots of the plurality of slots.

7. The antenna for plasma generation as claimed in claim 1, wherein the plurality of slots are evenly arranged in the circumferential direction.

8. The antenna for plasma generation as claimed in claim 7, wherein the plurality of slots are arranged symmetrically with respect to a central axis of the antenna for plasma generation.

9. The antenna for plasma generation as claimed in claim 1, wherein a pitch of the plurality of slots in a circumferential direction is $n(\lambda g/2)-\delta$, n being an integer greater than or equal to 1, $\lambda g$ being expressed as $\kappa_0/\sqrt{\in_r}$, where $\kappa_0$ represents a wavelength in free space and $\in_r$ represents a dielectric constant of a dielectric member, and $\delta$ being a fine adjustment component.

10. The antenna for plasma generation as claimed in claim 1, wherein a length of the plurality of slots in a circumferential direction is $n(\lambda g/2)-\delta$, n being an integer greater than or equal to 1, $\lambda g$ being expressed as $\lambda_0/\sqrt{\in_r}$, where $\lambda_0$ represents a wavelength in free space and $\in_r$ represents a dielectric constant of a dielectric member, and $\delta$ being a fine adjustment component.

11. The antenna for plasma generation as claimed in claim 4, wherein the first space between the portions of the overlapping slots penetrating through the gas flow path is made wider than the second space between portions of the overlapping slots opening out to the plasma generation space of the processing chamber by stepped portions arranged within the overlapping slots at an interfacial boundary between the gas flow path and the plurality of gas holes.

12. The antenna for plasma generation as claimed in claim 4, wherein each slot of the plurality of slots includes a left side outer portion, a center portion, and a right side outer portion, and each slot overlaps with an adjacent slot of the plurality of slots at the left side outer portion and the right side outer portion.

13. The antenna for plasma generation as claimed in claim 4, wherein the predetermined space between the overlapping slots is arranged such that the first space between the portions of the overlapping slots penetrating through the gas flow path is 5-15 mm.

14. The antenna for plasma generation as claimed in claim 1, wherein the plurality of slots are filled with a dielectric material.

15. A plasma processing apparatus comprising:
a gas supply source configured to supply gas;
a microwave output unit configured to output microwave power; and
an antenna for plasma generation configured to generate surface wave plasma using the microwave output from the microwave output unit, the antenna for plasma generation including
a gas flow path configured to pass the gas through the antenna for plasma generation;
a plurality of gas holes that communicate with the gas flow path and are configured to introduce the gas that has passed through the gas flow path into a processing chamber; and
a plurality of slots that are separated from the gas flow path and penetrate through the gas flow path, the plurality of slots being configured to pass the microwave that has been transmitted through a slow-wave plate via a coaxial waveguide and radiate the microwave into the processing chamber;
wherein adjacent slots of the plurality of slots are arranged such that a first space between portions of the adjacent slots penetrating through the gas flow path is wider than a second space between portions of the adjacent slots opening out to a plasma generation space of the processing chamber.

16. A plasma processing method using a plasma processing apparatus including an antenna for plasma generation configured to generate surface wave plasma, wherein the antenna for plasma generation includes
a gas flow path configured to pass gas through the antenna for plasma generation;
a plurality of gas holes that communicate with the gas flow path and are configured to introduce the gas that has passed through the gas flow path into a processing chamber; and
a plurality of slots that are separated from the gas flow path and penetrate through the gas flow path, the plurality of slots being configured to pass a microwave that has been transmitted through a slow-wave plate via a coaxial waveguide and radiate the microwave into the processing chamber;
wherein adjacent slots of the plurality of slots are arranged such that a first space between portions of the adjacent slots penetrating through the gas flow path is wider than a second space between portions of the adjacent slots opening out to a plasma generation space of the processing chamber;
the plasma processing method comprising the steps of:
supplying the gas from an outer periphery side of the plurality of slots, passing the gas through a region of the gas flow path positioned between the portions of the adjacent slots disposed apart by the first space, and introducing the gas to an inner periphery side of the plurality of slots; and
radiating the microwave into the processing chamber from the plurality of slots, propagating a surface wave of the microwave on a metal surface of the processing chamber, and converting the gas introduced into the processing chamber into plasma.

* * * * *